United States Patent

Rose et al.

[11] Patent Number: 6,025,602
[45] Date of Patent: *Feb. 15, 2000

[54] ION IMPLANTATION SYSTEM FOR IMPLANTING WORKPIECES

[75] Inventors: Peter H. Rose, N. Conway, N.H.; Julian G. Blake, Beverly Farms, Mass.; Adam A. Brailove; Zhongmin Yang, both of Boston, Mass.; Richard F. McRay, Saratoga Springs, N.Y.; Barbara J. Hughey, Lexington, Mass.

[73] Assignee: Eaton Corporation, Beverly, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 09/066,180

[22] Filed: Apr. 23, 1998

Related U.S. Application Data

[63] Continuation of application No. 08/756,133, Nov. 26, 1996, Pat. No. 5,793,050, which is a continuation-in-part of application No. 08/601,983, Feb. 16, 1996, abandoned.

[51] Int. Cl.⁷ ..................................................... H01J 37/20
[52] U.S. Cl. .................................. 250/492.21; 250/442.11
[58] Field of Search .......................... 250/492.21, 492.2, 250/441.11, 442.11, 443.1, 453.11

[56] References Cited

U.S. PATENT DOCUMENTS

| | | | |
|---|---|---|---|
| 3,954,191 | 5/1976 | Wittkower | 214/17 B |
| 4,000,426 | 12/1976 | Zaitseva et al. | 250/453.11 |
| 4,228,358 | 10/1980 | Ryding | 250/457 |
| 4,229,655 | 10/1980 | Ryding | 250/400 |
| 4,234,797 | 11/1980 | Ryding | 250/492.21 |
| 4,258,266 | 3/1981 | Robinson et al. | 250/492.21 |
| 4,346,301 | 8/1982 | Robinson et al. | 250/492.2 |
| 4,433,951 | 2/1984 | Koch et al. | 414/217 |
| 4,517,465 | 5/1985 | Gault et al. | 250/492.2 |
| 4,550,239 | 10/1985 | Uehara et al. | 219/121 |
| 4,553,069 | 11/1985 | Purser | 315/111.81 |
| 4,568,234 | 2/1986 | Lee et al. | 414/404 |
| 4,705,951 | 11/1987 | Layman et al. | 250/442.1 |
| 4,745,287 | 5/1988 | Turner | 250/492.2 |
| 4,836,733 | 6/1989 | Hertel et al. | 414/225 |
| 4,899,059 | 2/1990 | Freytsis et al. | 250/492.2 |
| 4,911,103 | 3/1990 | Davis et al. | 118/725 |
| 4,917,556 | 4/1990 | Stark et al. | 414/217 |
| 5,229,615 | 7/1993 | Brune et al. | 250/492.2 |
| 5,306,918 | 4/1994 | Goudonnet et al. | 250/442.11 |
| 5,308,989 | 5/1994 | Brubaker | 250/441.11 |
| 5,404,894 | 4/1995 | Shiraiwa | 134/66 |
| 5,478,195 | 12/1995 | Usami | 414/786 |
| 5,751,003 | 5/1998 | Rose et al. | 250/492.21 |

FOREIGN PATENT DOCUMENTS

| | | |
|---|---|---|
| 0389190 | 11/1990 | European Pat. Off. . |
| 0690480 | 1/1996 | European Pat. Off. . |

*Primary Examiner*—Kiet T. Nguyen
*Attorney, Agent, or Firm*—Lahive & Cockfield, LLP; Anthony A. Laurentano

[57] ABSTRACT

An ion implantation system that rapidly and efficiently processes large quantities of workpieces, such as flat panel displays. The ion implantation system includes a high vacuum process chamber that mounts an ion source, a single workpiece translating stage, and a loadlock. The single workpiece handling assembly mounted within the process chamber both removes the workpiece from the loadlock and supports the workpiece during implantation by the ion beam generated by the ion source. The process chamber is in selective fluid communication with a loadlock assembly, which in turn is mechanically integrated with a workpiece loading or end station. Additionally, the workpiece handling assembly includes a translation stage or element for translating the workpiece in a linear scanning direction during implantation. This linear scanning direction extends along a path transverse or orthogonal to the horizontal longitudinal axis of the implantation system. According to one practice, the scanning direction and the longitudinal axis form an angle therebetween that is less than or equal to about 85 degrees.

30 Claims, 13 Drawing Sheets

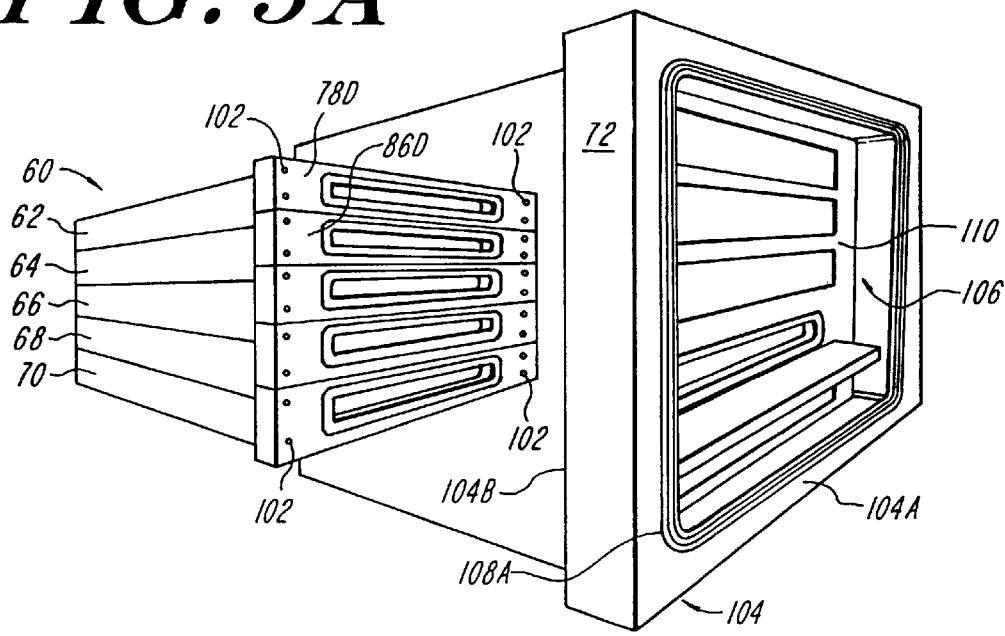
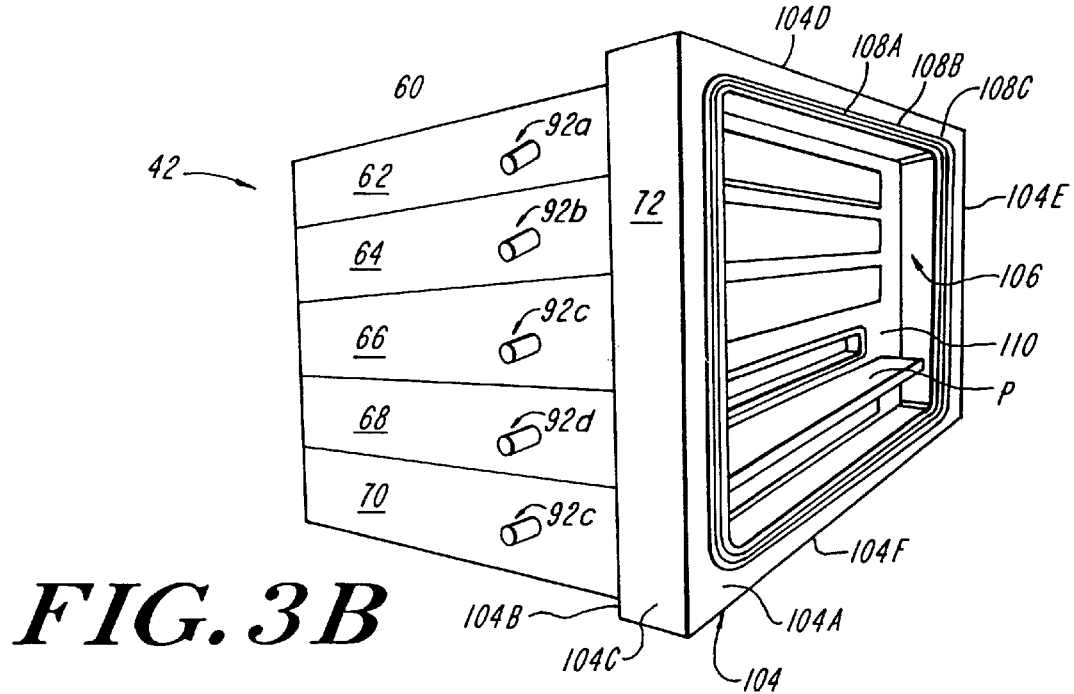

ION IMPLANTATION SYSTEM FOR IMPLANTING WORKPIECES

REFERENCE TO RELATED APPLICATIONS

This application is a continuation application of Ser. No. 08/756,133, now U.S. Pat. No. 5,793,050 which is a continuation-in-part application of Ser. No. 08/601,983 (now abandoned), filed Feb. 16, 1996, entitled "Ion Implantation System For Flat Panel Displays", and is related to the commonly assigned application Ser. No. 08/756,972 (now U.S. Pat. No. 5,828,070), filed herewith, entitled "System And Method For Cooling Workpieces Processed By An Ion Implantation System"; application Ser. No. 08/757,726 (now U.S. Pat. No. 5,811,823), filed herewith, entitled "Control Mechanisms For Dosimetry Control In Ion Implantation Systems"; application Ser. No. 08/756,656 (now U.S. Pat. No. 5,825,038), filed herewith, entitled "Large Area Uniform Ion beam Formation"; and application Ser. No. 08/756,372 (now abandoned), filed herewith entitled "Loadlock Assembly For An Ion Implantation System". The teachings of all the foregoing applications are incorporated herein by reference.

BACKGROUND OF THE INVENTION

The present invention relates to processing systems for processing workpieces, and more particularly, to high throughput ion implantation systems and methods for implanting workpieces.

Ion implantation has become a standard, commercially accepted technique for introducing conductivity-altering dopants into a workpiece, such as a semiconductor wafer or thin film deposition on a glass substrate, in a controlled and rapid manner. Conventional ion implantation systems include an ion source that ionizes a desired dopant element which is then accelerated to form an ion beam of prescribed energy. This beam is directed at the surface of the workpiece. Typically, the energetic ions of the ion beam penetrate into the bulk of the workpiece and are embedded into the crystalline lattice of the material to form a region of desired conductivity. This ion implantation process is typically performed in a high vacuum, gas-tight process chamber which encases a workpiece handling assembly, a workpiece support assembly, and the ion source. This high vacuum environment prevents dispersion of the ion beam by collisions with gas molecules and also minimizes the risk of contamination of the workpiece by airborne particulates.

The process chamber is typically coupled via a valve assembly with a processing end station. The end station can include an intermediate loadlock chamber or pressure lock which can be pumped down from atmospheric pressure by a vacuum pumping system. The chamber is selectively closed at a downstream end by the valve assembly, which selectively places the loadlock chamber in fluid communication with the process chamber. The loadlock chamber is also coupled at an opposite end to an upstream valve assembly. The end station also includes an end effector which transfers workpieces from one or more workpiece cassettes, through the upstream valve assembly, and into the chamber. Once a workpiece has been loaded into the intermediate chamber by the end effector, the chamber is evacuated via the pumping system to a high vacuum condition compatible with the process chamber. The valve assembly at the downstream end of the intermediate chamber then opens and the workpiece handling assembly mounted within the process chamber removes the workpiece from the intermediate chamber and transfers the workpiece to the support assembly, which supports the workpiece during processing. For example, a loading arm of the workpiece handling assembly removes the workpiece from the intermediate chamber and places it on a platen of the workpiece support structure. The workpiece support then moves the workpiece in the scanning direction past the operating ion source, which implants the workpiece.

A conventional workpiece support structure includes a rotating disc that mounts a plurality of workpieces, or includes a structure for moving the workpiece in a horizontal scanning direction. The multiple movements of the components of the ion implantation system consume valuable processing time, thus reducing the throughput of the system.

Today's burgeoning semiconductor and implantation technology has found widespread acceptance in the marketplace. With this acceptance has come demands for generating large quantities of implanted workpieces at competitive prices. A common goal of most modern implantation systems is to satisfy these demands by increasing the throughput of the system. Presently existing systems, however, are not well suited to meet these manufacturing and cost demands.

Another major problem of present commercial ion implantation systems concerns the costs of operating the facility. Conventional ion implantation systems require relatively large dedicated space and thus have a high associated cost per square foot. Consequently, traditional implantation systems have been relatively expensive to operate.

Hence, there exists a need in the art for improved ion implantation systems and methods that exhibit high throughput, require less floor space, and are more cost efficient to operate. In particular, ion implantation systems that can rapidly process high volumes of workpieces would represent a major improvement in the art.

SUMMARY OF THE INVENTION

The present invention provides a high throughput ion implantation system that employs a single workpiece handling assembly to handle and to process in a rapid and efficient manner large quantities of workpieces, such as flat panel displays. The ion implantation system of the present invention is designed to process flat panels of various sizes, including panels having dimensions of 550 mm by 650 mm and larger.

The ion implantation system can include a process housing defining a high vacuum process chamber that mounts an ion source and a single workpiece handling assembly. The workpiece handling assembly removes the workpiece from a loadlock chamber and supports the workpiece during implantation by the ion beam generated by the ion source. The process chamber is in selective fluid communication with the loadlock chamber, which in turn is mechanically integrated with a workpiece loading or end station.

According to one aspect of the invention, the workpiece handling assembly can include a translation stage or element for translating the workpiece in a linear manner during implantation. This linear translation direction can be a horizontal translation direction, or it can be tilted, e.g., transverse or orthogonal, relative to the horizontal axis of the implantation system. According to one practice, translation of the workpiece is conducted along a planar path that is tilted at an angle relative to the horizontal axis that is less than or equal to about 85 degrees.

According to another aspect, the ion beam generated by the ion source extends in a direction transverse to the longitudinal axis, and according to one embodiment, is generally parallel to the transverse translation direction. The translation stage moves the workpiece through the ion beam in the scanning direction.

According to another aspect, the workpiece handling assembly includes a platen for supporting the workpiece during processing, and structure for moving the position of the platen relative to the loadlock chamber.

In another aspect, the system further includes a pump assembly, e.g., a pressure regulator, that is coupled to the loadlock chamber for disposing the loadlock chamber at a selected pressure. In still another apsect, the system includes a temperature control element coupled to the loadlock for disposing at least a portion of the loadlock or workpiece at a selected temperature.

According to another aspect, the system includes cooling structure for disposing the floor of the loadlock chamber at a selected temperature to form a cold deck. A vacuum network can also be coupled to the chamber floor for drawing the workpiece into contact therewith when the workpiece is disposed within the chamber, thereby effecting heat transfer from the workpiece to the chamber floor. The vacuum network can comprise a duct network (e.g., a plurality of transverse fluid grooves) formed within the chamber floor and in fluid communication with a vacuum source for disposing a substantial portion of the backside of the workpiece in contact with the cooling surface.

According to still another aspect, the ion implantation system includes structure, such as a fluid conduit in communication with a fluid source, for circulating a cooling fluid through the chamber floor to form a cooling surface.

According to still another aspect, the loadlock assembly includes a plurality of loadlock elements that are axially positioned relative to each other to form a stacked array of loadlocks. This stacked array of loadlock elements forms an axial stack of loadlock chambers. Furthermore, each loadlock of the array nests with an adjacent loadlock when stacked together. According to one practice, a bottom surface of one of the loadlocks has a first geometric shape and a top surface of an adjacent loadlock has a complementary geometric shape such that the loadlocks nest together when stacked. According to one practice, the bottom surface of each loadlock has a first bottom-most side, an outwardly stepped second bottom side, and a further outwardly stepped third bottom side. The top surface of each loadlock has a first topmost face, a recessed second face which is separated from the first face by a first wall portion, and a further recessed third top face. This stacked array of loadlocks facilitates processing of multiple workpieces by the ion implantation system.

The ion implantation system further provides an ion source that generates an ion beam, and is coupled to a housing defining a process chamber. The process chamber is coupled to a loadlock chamber. A workpiece handling assembly is mounted within the process chamber for supporting the workpiece during implantation by the ion beam generated by the ion source, such that the handling assembly translates the workpiece in a linear scanning direction transverse to the horizontal longitudinal axis of the implantation system during processing.

According to one aspect, the plane of the workpiece is tilted at an angle relative to the system's horizontal plane equal to or less than about 85 degrees. Additionally, the ion beam generated by the ion source is directed transverse to the longitudinal axis to form an angle therebetween greater than or equal to about 5 degrees. Thus, the workpiece is translated in a nearly vertical orientation, and the ion source is likewise mounted at an angle to ensure substantially orthogonal bombardment of the workpiece with ions.

The invention will next be described in connection with certain preferred embodiments. However, it should be clear that various changes and modifications can be made by those skilled in the art without departing from the spirit and scope of the invention.

BRIEF DESCRIPTION OF THE DRAWINGS

The foregoing and other objects, features and advantages of the invention will be apparent from the following description and apparent from the accompanying drawings, in which like reference characters refer to the same parts throughout the different views. The drawings illustrate principles of the invention and, although not to scale, show relative dimensions.

FIGS. 3A–3B are an exploded perspective view of the loadlock assembly of the present invention;

DESCRIPTION OF ILLUSTRATED EMBODIMENTS

Figure 1A:
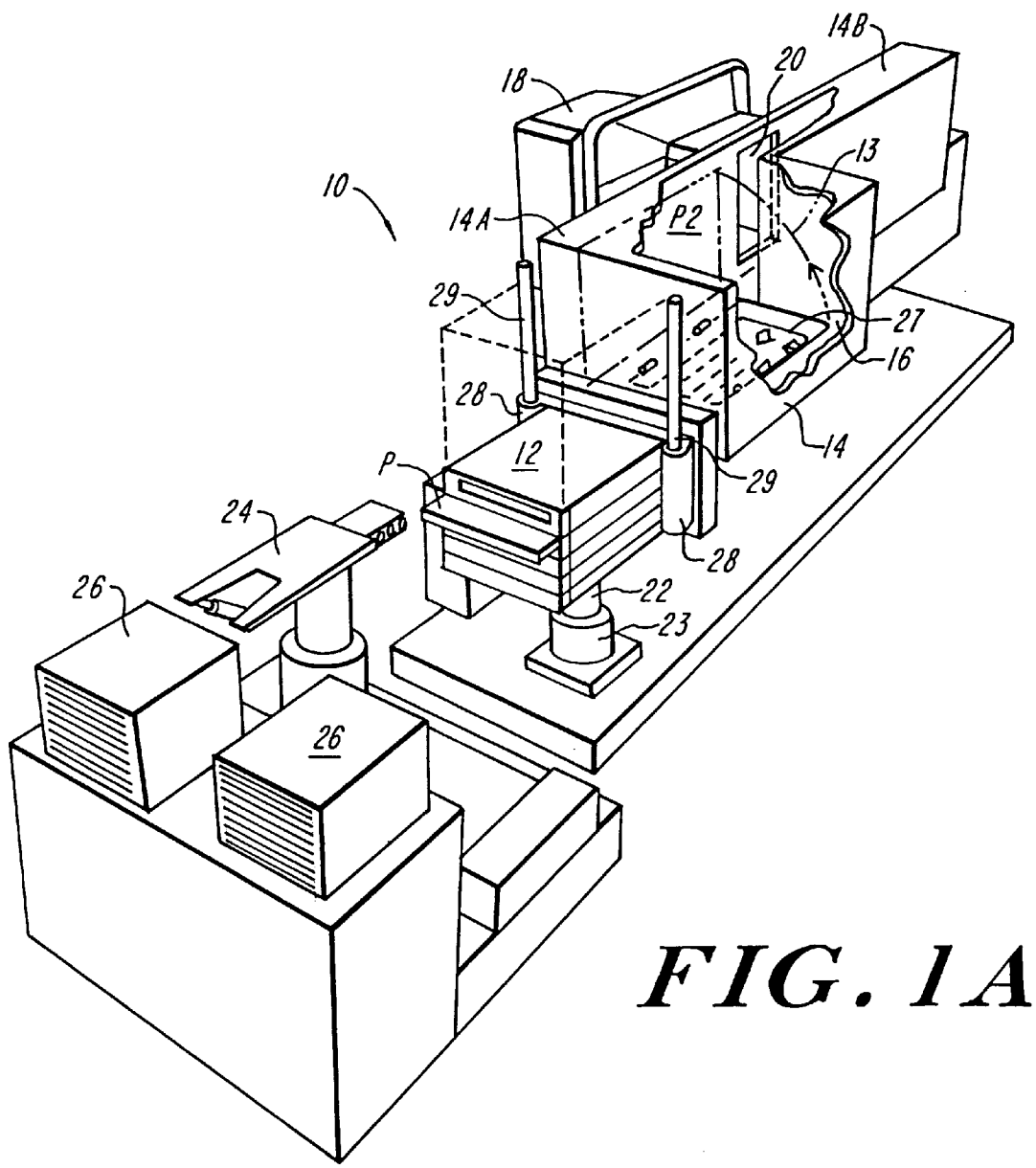
FIG. 1A is a perspective view of one embodiment of the ion implantation system according to the present invention.
Figure 1B:
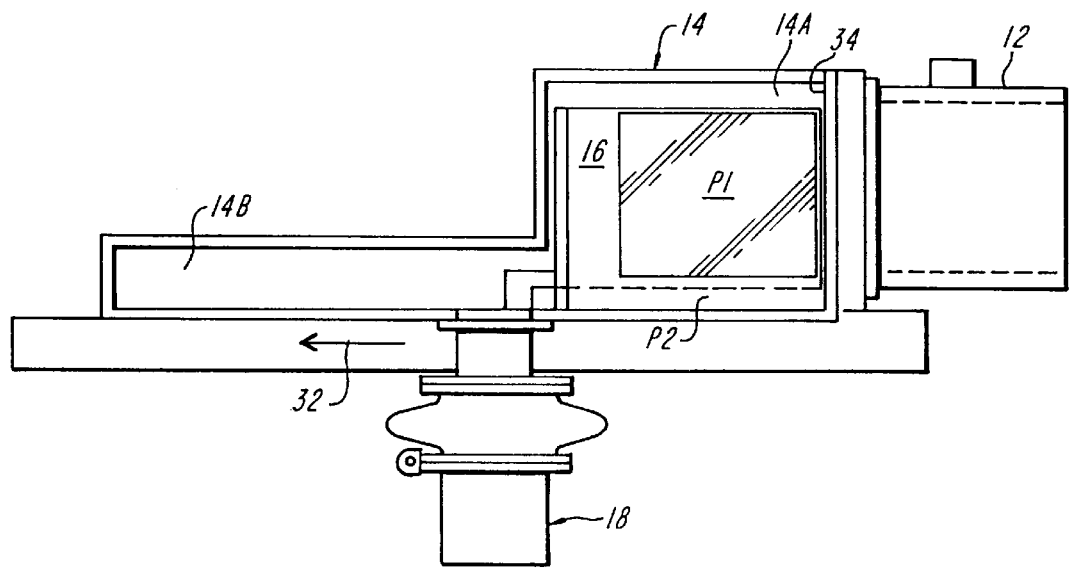
FIG. 1B is a top view of a portion of the ion implantation system of FIG. 1A.

With reference to FIGS. 1A and 1B, the ion implantation system 10 of the present invention includes a pair of panel cassettes 26, an end effector 24, an assembly of loadlock chambers 12, a housing 14 which defines a process chamber 16, and an ion source 18, which communicates with the process chamber 16 through beam aperture 20. An end effector 24 transfers workpieces, such as flat panels P, stacked in cassette 26 to the loadlock assembly 12.

The illustrated end effector 24 is coupled to a conventional drive and control mechanism which provides power to the end effector and which controls the rate and sequence of panel movement. The panel cassettes 26 are of conventional design and provide a convenient storage facility for the panels.

The loadlock assembly 12 is also coupled to a linear bearing system and a linear drive system, which provide the desired vertical movement of the loadlock assembly 12 as well as place and hold the loadlock assembly 12 in sealing contact with the process chamber housing 14, as described in further detail below. The linear drive system includes a lead screw 22 and a motor assembly 23. The motor assembly 23 drives the lead screw 22 which in turn positions the loadlock assembly 12 at a selected vertical position, as indicated in dashed lines. The linear bearing system includes a pair of stationary linear bearings 28 mounted to the loadlock assembly which slide along circular shafts 29.

A translation or workpiece holding assembly is preferably mounted within the process chamber 16. The translation assembly includes a pickup arm 27 which is similar in function to the end effector 24. The pickup arm 27 handles the panel P during processing. When the pickup arm 27 initially removes the panel P from the loadlock assembly 12, it is oriented in a substantially horizontal position P1. The pickup arm then vertically flips the panel, as denoted by arrow 13, into a substantially vertical position P2. The translation assembly then moves the panel in a scanning or translation direction, from left to right in the illustrated embodiment, across the path of an ion beam emerging from aperture 20, and which is generated by the ion source 18.

According to another embodiment, the pickup arm 27 can tilt the panel P relative to its original horizontal position prior to translating the panel. In this embodiment, the ion source 18 is positioned on the process housing 14 to ensure substantially orthogonal bombardment of the workpiece with ions.

With further reference to FIGS. 1A and 1B, the process chamber housing 14 includes a front housing portion 14A and a narrower elongated portion 14B. The front housing portion is sized to accommodate the removal of the panel P from the loadlock assembly 12 in the horizontal position. The panel is then moved from the original horizontal position P1 to the vertical position P2 prior to movement along the scanning direction, indicated in FIG. 1B by arrow 32. The housing portion 14B has an axial dimension along the scanning direction that allows the panel to pass completely by the ribbon beam generated by the ion source 18. The relatively narrow width of the chamber portion 14B preferably allows the panel to move therealong only when disposed in the vertical position P2 to reduce the total volume of the process chamber 16. This reduction in chamber volume allows faster evacuation of the process chamber. Reducing the time necessary to evacuate the chamber serves to increase the total throughput of the implantation system 10.

The illustrated loadlock assembly 12 is preferably sealingly coupled to the front chamber wall 34 of the chamber housing 14. The loadlock assembly 12 maintains a relatively pressure-tight and fluid-tight seal with the chamber wall 34 during the vertical movement of the loadlock assembly 12. This sliding seal-tight arrangement is described in further detail below.

Referring again to FIG. 1A, the ion source 18 in conjunction with the aperture 20 forms a ribbon beam which has dimensions smaller than the dimensions of the panel to be processed. More specifically, the ion source 18 generates a ribbon beam 19 whose width (e.g., axial height) just exceeds the narrow panel dimension and whose length is substantially smaller than the total length of the panel, e.g., the larger panel dimension, FIG. 13. The use of a ribbon beam in conjunction with the ion implantation system 10 of the present invention provides for several advantages, including (1) the ability to process panel sizes of different dimensions with the same system; (2) achieving a uniform implant which can be controlled by varying the scan velocity of the panel and by sampling the current of that portion of the ion beam that extends beyond the narrow panel dimension; (3) the size of the ion source can be reduced and is thus less expensive and easier to service; and (4) the ion source can be continuously operated. The continuous operation of the ion source increases the efficiency of the ion implantation system 10 since it produces a more uniform implant by eliminating problems associated with repeatedly turning the ion source off and on, as in prior approaches. These problems typically include beam current density transients which occur upon start-up operation of the source.

Figure 2:
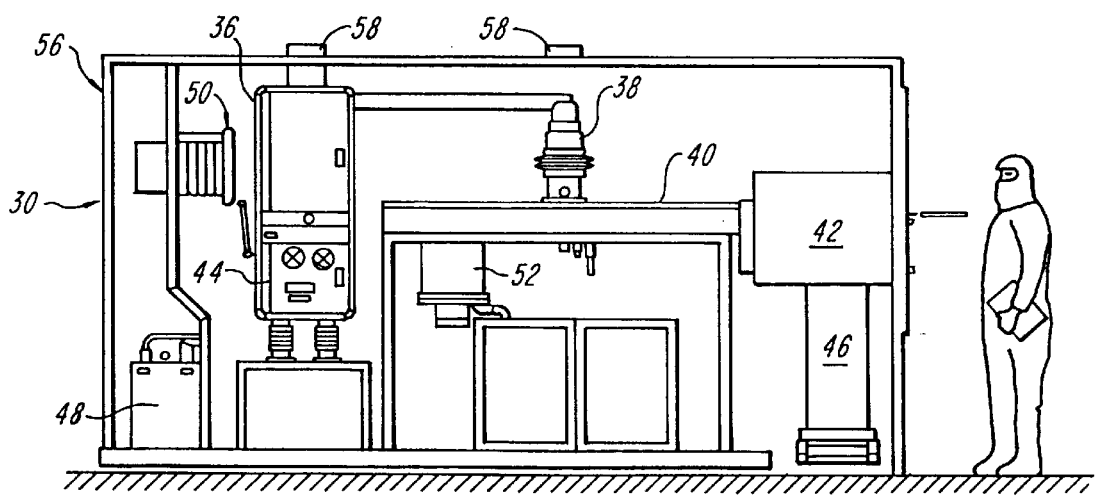
FIG. 2 is a perspective view of an alternate embodiment of the ion implantation system of the present invention.

FIG. 2 is a schematic depiction of an alternate embodiment of the ion implantation system 30 according to the present invention. The illustrated system includes a loadlock assembly 42 which communicates with a separate service chamber 46 and with the process chamber 40. An ion source 38 is in fluid communication with the process chamber 40, and with a gas box 36 and associated control electronics 44, as is known in the art. The illustrated ion source and gas box assembly are coupled to a power system that includes an isolation transformer 48 and a voltage stack 50. The process chamber 40 can be evacuated by known pumping techniques, such as by the vacuum assembly 52. Any particular exhaust generated during the implantation procedure can be exhausted from the outer housing 56 through exhaust ports 58.

The illustrated loadlock assembly 42 is intended to encompass any suitable loadlock assembly that maximizes throughput by continuously cycling panels through the process chamber 40. For example, the loadlock assembly 42 can include the stacked loadlock assembly of FIGS. 3A–6 or the dual serial loadlock assembly of FIG. 8. Additionally, the illustrated system 30 further shows that the flat panel can be implanted from above while maintained in a substantially horizontal position when translated in the linear scanning direction.

FIGS. 3A through 5 illustrate a first embodiment of the loadlock assembly 60 of the present invention. The illustrated loadlock assembly 60 includes a set of individual loadlock elements designated as loadlocks 62, 64, 66, 68 and 70. The loadlocks are preferably stackable and, according to a preferred practice, nestable to form a multi-chamber loadlock assembly 60 that provides for rapid cycling of panels to form a high throughput ion implantation system. The illustrated stacked set of loadlocks extend along axis 93. The set of loadlocks can also be secured to a front flange 72. The front flange 72 functions as an interface between the multi-chamber loadlock assembly 60 and the interface of the process chamber, e.g., wall 34 of housing 14. Those of ordinary skill will recognize that the loadlock assembly can be directly coupled to the process chamber without utilizing an intermediate flange member, such as front flange 72.

Figure 4A:
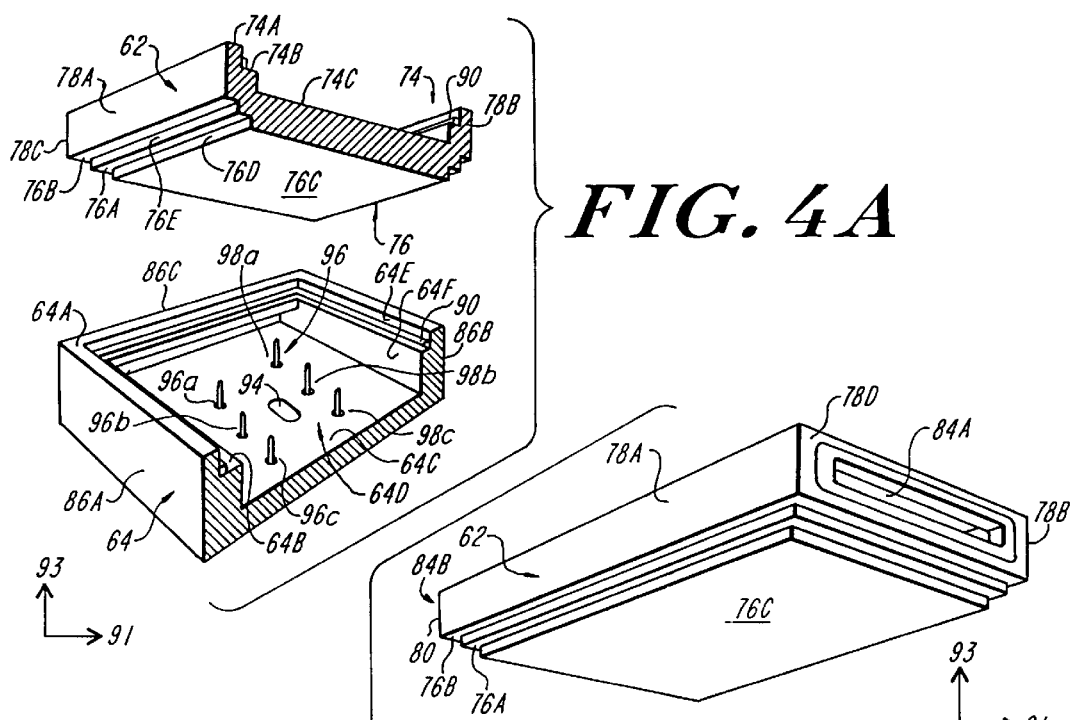
FIGS. 4A–4B are an exploded view of each constituent loadlock of the loadlock assembly of FIGS. 3A–3B.
Figure 4B:
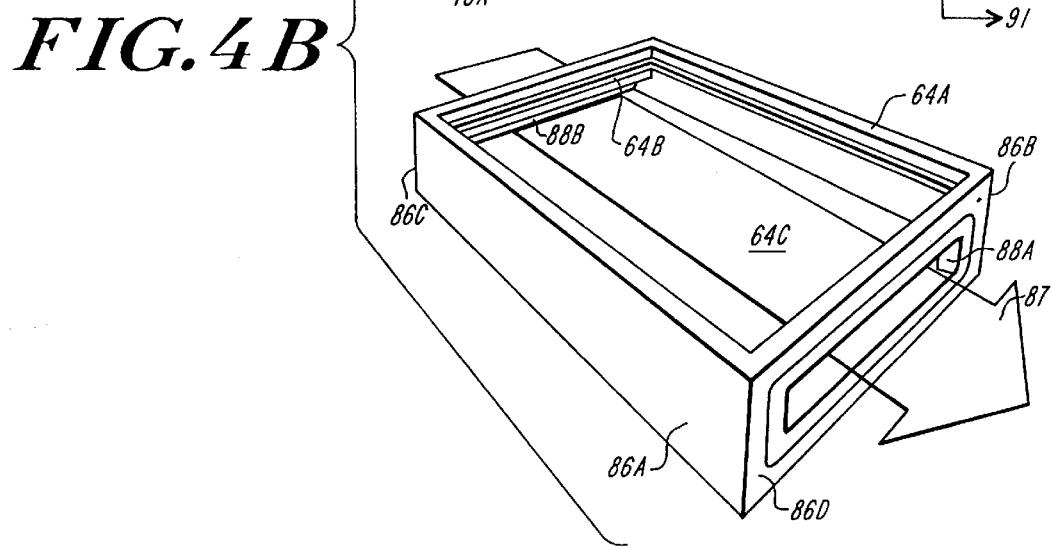
Figure 4C:
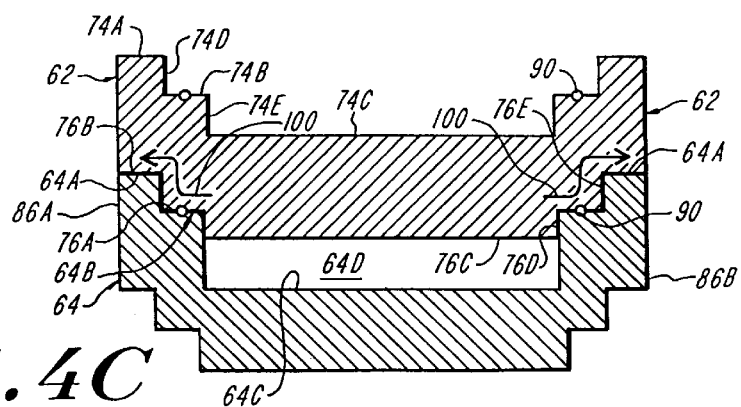
FIG. 4C is a cross-sectional view of a pair of nested loadlocks of the loadlock assembly of FIGS. 3A–3B.

With reference to FIGS. 4A through 4C, each loadlock element of the loadlock assembly 60 has a selected configuration that facilitates stacking and nesting of the loadlocks. For example, loadlock 62, which is representative of any of loadlocks 62–70, includes a stepped top surface 74 and a stepped bottom surface 76. The stepped top surface 74 preferably includes a first outermost top surface 74A and an inwardly stepped or recessed surface 74B separated therefrom by a vertically extending wall 74D. The loadlock surfaces preferably extend, in a first orientation, along a horizontal axis 91, and the wall portion extends along axis 93. The top surface includes a further inwardly stepped surface 74C which forms the floor of the loadlock chamber. The surface 74C is separated from the stepped surface 74B by a second wall portion 74E, parallel to wall portion 74D, and which forms a sidewall of the loadlock chamber.

Similarly, the stepped bottom portion 76 of the illustrated loadlock 62 includes a vertically bottom-most surface 76C and an outwardly stepped surface 76A, each surface being separated by a wall portion 76D which extends along axis 93. The bottom surface 76 includes a further outwardly stepped surface 76B, which is separated from the adjacent stepped surface 76A by a wall portion 76E. The wall portions 76E and 76D are preferably substantially parallel to each other. The bottom-most surface 76C of the loadlock bottom surface forms the roof of the adjacent loadlock chamber, e.g., loadlock chamber 64, in the stacked array.

The illustrated loadlock 62 further includes a pair of parallel sidewalls 78A and 78B, which are spaced apart along axis 91. The sidewalls 78A and 78B, as well as the stepped top and bottom surfaces 74, 76, terminate in a frontwall 78D and a rearwall 78C. The front and rear walls have appropriately sized slots 84A and 84B formed therein and disposed in registration with each other to allow passage of a panel, FIG. 4B.

The illustrated loadlock 64 also includes a similarly formed stepped top and bottom surface. The loadlock 64 includes an outer top surface 64A, an inwardly stepped surface 64B, and a further inwardly stepped surface 64C which forms the bottom of the process chamber 64D. The stepped surfaces 64A, 64B, 64C are separated by wall portions 64E and 64F, which are axially spaced apart and generally parallel to each other. Loadlock 64 further includes parallel sidewalls 86A, 86B, and back and front walls 86C and 86D, respectively. The front wall 86D has a panel slot 88A formed therein that is in registration with panel slot 88B formed in backwall 86C. These panel slots are also sized to allow passage of a panel, as illustrated by arrow 87.

With further reference to FIG. 4A, the stepped top surface 74B of loadlock 62 can have formed therein a peripheral seat or channel which mounts an elastomeric member 90, e.g., an O-ring. The O-ring helps form a pressure tight seal along the periphery of the plate surface 74B, as is described in further detail below.

The floor portions 74C and 64C of loadlocks 62, 64 preferably include a selectively deployable workpiece support assembly, such as pin assembly 96. The pin assembly includes two linear sets of pins 96A–96C and 98A–98C. The illustrated pin assembly 96 is selectively deployable by appropriate control electronics between a deployed position where the pins outwardly extend from the bottom surface of the chamber, as shown, and a stowed position where the pins retract within appropriate passageways. The pin assembly 96 can be actuated into the deployed position to support a panel thereon. In this spaced position relative to the bottom portion 64C, the pickup arm mounted within the process chamber 16 (and shown in FIG. 10) can easily access and remove the panel from the loadlock 64. According to another embodiment, the workpiece support assembly can employ a series of selectively deployable support arms, such as those shown and described in Attorney Docket No. ETE-002, the teachings of which were previously incorporated by reference.

The bottom-most surface 64C further includes a vacuum port 94 preferably formed in a central location thereon. The vacuum port can be coupled to a conventional pumping assembly to either pump down or vent the loadlock chamber, or to apply a vacuum pressure to the backside of the panel P.

The illustrated loadlocks 62, 64 can be stacked or assembled by vertically aligning loadlock 62 with the bottom loadlock 64 such that the outwardly stepped bottom portion 76A of loadlock 62 contacts the O-ring 90 mounted on the first inwardly stepped top portion 64B of loadlock 64. Furthermore, the bottom outermost stepped surface 76B contacts the top surface 64A of loadlock 64. In this arrangement, the bottom most surface 76C of loadlock 62 forms the roof of the loadlock chamber 64D, FIG. 5, and the recessed top surface 64C of loadlock 64 forms the floor of the chamber. As the loadlocks are stacked together, the bottom surface of the upper loadlock forms the roof of the chamber disposed therebeneath. Those of ordinary skill will recognize that the loadlocks can have other geometric shapes that promote the stacking and nesting together of a plurality of loadlocks. For example, the loadlocks can be dove-tailed together or fashioned to have a tongue-in groove configuration.

FIG. 4C depicts the loadlocks 62 and 64 of FIGS. 4A and 4B stacked and nested together. The elastomeric member 90 seats between the adjacent loadlocks to form a pressure seal therebetween. Furthermore, the mating relationship of the loadlock surfaces further create a pressure seal along these mating surfaces, for example, along surfaces 76A, 648 and 76B, 64A and along the vertical walls of the loadlocks that extend between the horizontal sealing surfaces. Thus, the multiple mating surfaces of the loadlocks 62, 64 when nested together form a secondary or redundant pressure seal.

The telescopic engagement of loadlocks 62 and 64 form loadlock chamber 64D. The chamber 64D preferably has a relatively small volume to facilitate rapid pumping of the chamber 64D. This feature reduces processing time, which increases the throughput of the ion implantation system.

With reference to FIGS. 3A and 3B, multiple loadlocks 62–70 can be stacked together to form the stacked loadlock assembly 60. The total number of nested loadlocks can be chosen to maximize the throughput of the ion implantation system 10. For example, the number of loadlocks can be selected by one of ordinary skill to minimize processing time to provide for a continuous and rapid cycling of panels. According to a preferred practice, a set of five stacked loadlocks forming four loadlock chambers are employed. Those of ordinary skill will recognize that other stacked arrangements utilizing varying numbers of loadlocks can be employed to facilitate rapid processing of panels.

The front faces of the loadlocks, for example, front face 78D of loadlock 62 and front face 86D of loadlock 64, can have fastener-receiving apertures 102 formed therein at peripheral locations, as illustrated. The front portion 60A of the loadlock assembly is affixed to front flange 72, which functions as the interface between the loadlock assembly 60 and the housing 14 of the process chamber 16, by suitable fasteners, such as bolts 124A–124E, FIG. 5.

The illustrated flange 72 includes a rectangular outer portion 104 having a front face 104A, back face 104B and peripheral side portions 104C–104F. The front sealing face 104A has formed thereon three concentric grooves which seat elastomeric seals 108A–108C. The seals preferably have a high wear resistance and can be formed of high molecular weight polyethylene. The three successive concentric seals are provided so that each individual seal is not exposed to a full atmospheric to high-vacuum differential pressure. The grooves formed on the front face 104A are preferably sized to accommodate slight movement of the seals within the grooves during the sliding movement of the front surface 104A with surface 34 of the process chamber housing 34.

Between-seal pumping can be employed to differentially pump between each of the seals 108A–108C to lower the drop in pressure that must be achieved across any one particular seal. This between-seal pumping can be provided by a conventional rotary vane, two-stage pumping system which includes pressure ports that are formed between the seals 108A and 108B, and between seals 108B and 108C. The pressure within the pressure port located between seals 108A and 108B can be pumped to about 1 Torr, and the pressure within the pressure port located between seals 108B and 108C can be pumped to about 0.1 Torr.

Figure 5:
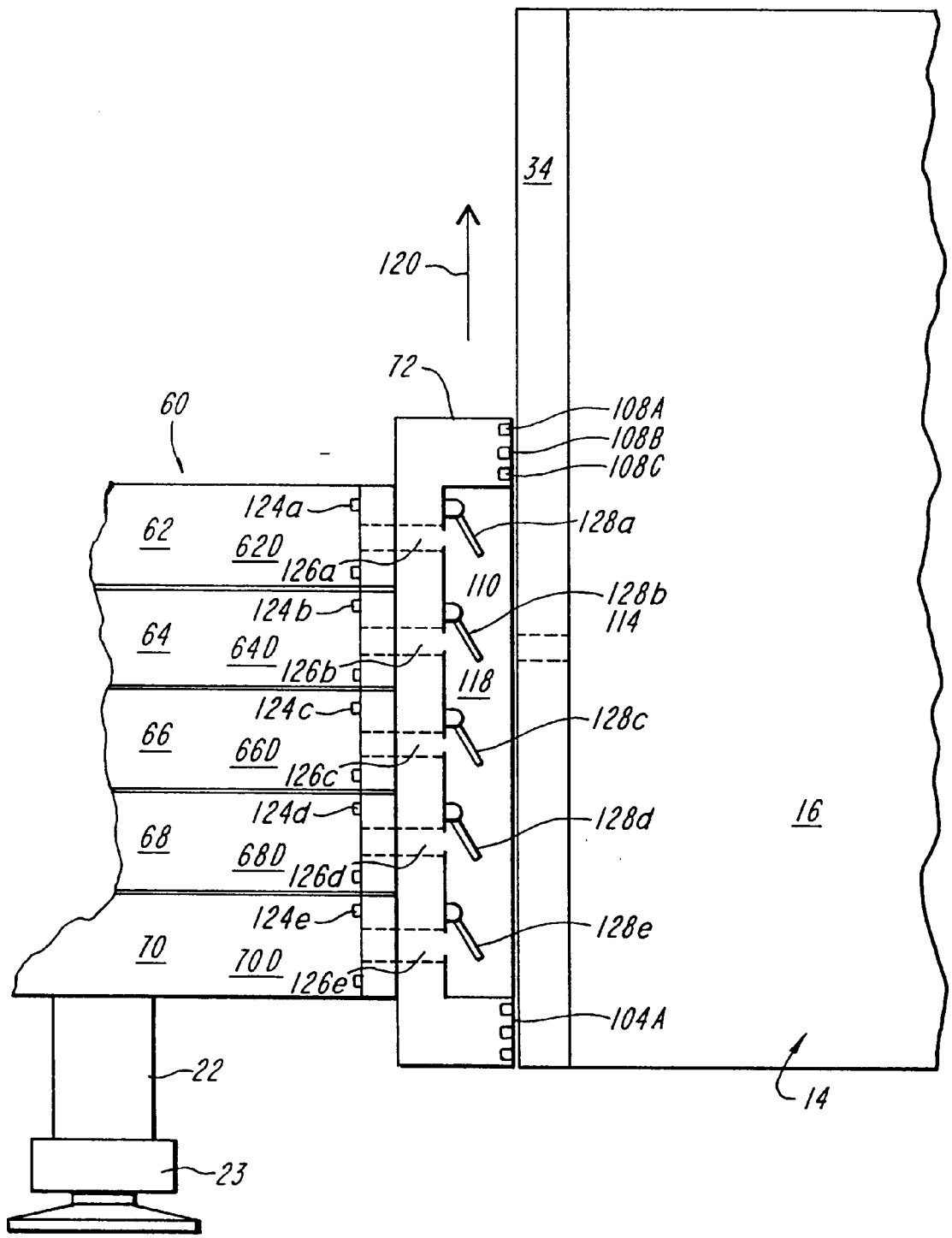
FIG. 5 is a cross-sectional view of the loadlock and process chamber of FIG. 1A illustrating the sliding seal arrangement of the present invention.

With reference to FIGS. 3A, 3B and 5, the recess 106 of the flange 72 terminates in a backwall 110 having formed therein a plurality of vertically aligned slots 126A–126E that correspond to the slots formed in the stacked loadlock elements of the loadlock assembly 60. Thus, when the front flange 72 is secured to the loadlock assembly 60, the front flange slots 126A–126E vertically and horizontally align with the respective slots of each of the loadlocks 62–70, FIG. 5. Each of the flange slots 126A–126E also have associated therewith a valve assembly 128A–128E. For example, slot 126A of the front flange 72 has associated therewith valve assembly 128A. The valve 128A is selectively actuatable to seat over the slot 126A to seal the chamber 62D of loadlock 62.

Referring to FIGS. 1A and 5, the front surface 34 of the process chamber housing 14 preferably has formed therein a panel aperture 114 which corresponds in dimensions to slots 126A–126E. The panel aperture 114 is preferably in fluid communication with the process chamber 16 and the cavity 118 formed by the front flange recess 106. This cavity 118 can be evacuated to match the high vacuum pressure state of the process chamber 16, or can be vented to match the lower vacuum pressure state of the loadlock chambers 62D–70D. This differential pumping relaxes the pumping and venting requirements of each individual loadlock during panel transfer, since each loadlock need not be pumped down to the high vacuum pressure of the process chamber.

The loadlock assembly 60 and the front flange 72 are preferably mounted on the linear bearing system and linear support system of FIG. 1A. The bearings 28 are preferably coupled to the rear 104B of the flange 72. Additionally, the front surface 104A of the front flange is preferably placed in sliding sealing engagement with the chamber wall 34. The illustrated linear bearing system preferably moves the loadlock assembly 60 in the vertical direction, as indicated by arrow 120, to attain a selected vertical position. According to a preferred embodiment, a control system controls the vertical movement of the loadlock assembly such that the panel aperture 114 aligns with one of the apertures 126A–126E of the front flange 72. During this vertical movement, the seals 108A–108C slidingly engage with the chamber wall 34. This sliding engagement permits the vertical movement of the loadlock assembly relative to the chamber wall 34 while maintaining a pressure seal therebetween. To enhance the sliding engagement between the seals 108A–108C and the chamber wall 34, the chamber wall can be lapped to reduce the frictional resistance to lateral motion of the loadlock assembly 60 and thus improve wear vacuum reliability.

In operation, the end effector 24, FIG. 1A, removes a panel P from one of the cassettes 26 and inserts it through a slot of one of the respective loadlocks 62–70. The end effector 24 can thus load one or more of the loadlocks with a panel. After loading the panels P into the loadlocks, valve assemblies associated with each slot are closed, and the chambers 62D–70D are pumped down to the high vacuum pressure of the process chamber 16. In an alternate embodiment, the cavity 118 can be maintained at an intermediate pressure between the pressures of the loadlock and the process chamber. In this circumstance, the loadlock chamber 62D–70D need only be pumped down to some intermediate pressure higher than the vacuum condition of the process chamber 16.

The linear bearing system vertically positions the loadlock assembly 60 at a selected vertical position. In this selected position, the panel aperture 114 formed in the sliding surface 34 of the process chamber housing 14 aligns with one of the slots 126A–126E of the flange 72. For example, in the illustrated embodiment, panel aperture 114 aligns with slot 126B. Valve 128B is then opened and the pickup arm mounted within the process chamber retrieves the panel P from chamber 64D and places it into the process chamber 16. As previously described, the pickup arm then imparts a vertical movement to the panel to move the panel from the horizontal position P1 into the vertical position P2. The pickup arm is then moved in the scanning direction and the panel is implanted by the ion source. After processing, the pickup arm returns the processed panel to the loadlock 64. According to one practice, the processed panel, which has been heated during implantation by the energized ions of the ion beam, is placed on the pin assembly 96 or other suitable support structure coupled to the loadlock 64. The pin assembly, which has been disposed in the deployed position, allows the pickup arm to retrieve as well as return the panel to the loadlock chamber 64D.

The linear bearing system then positions the assembly at a different vertical position to allow the pickup arm to access another chamber, which has also been pumped down and its associated downstream valve opened, to continue the cycling of panels through the process chamber. As the second panel is being implanted, chamber 64D can further process the implanted and heated panel. For example, the panel can be convectively cooled by flowing a cooling fluid through the chamber via one of the vacuum ports 92A–92E, and in this example, vacuum port 92B. Alternatively, the pin assembly 96 or other support assembly can be moved from the deployed position into the stowed position to place the panel into contact with the floor 64C of the chamber, FIG. 4A. The chamber floor because of its size can form a heat exchanging surface which conductively transfers heat from the panel. The loadlock floor 64C can be cooled by providing a supplemental cooling fluid thereto via appropriate fluid conduits. For example, fluid conduits can be formed within the loadlock to circulate a cooling fluid therethrough, or cooling tubes containing a cooling medium can be mounted about the peripheral or outer portion of the loadlock. To enhance the uniformity of cooling of the panel, a vacuum pressure can be applied to the backside of the panel through the vacuum port 94 (or other suitable vacuum network)

formed in the floor 64C of the loadlock 64. This vacuum pressure forces the panel into cooling contact with the floor 64C of the loadlock, to attain substantially uniform conductive cooling thereof. During this conductive cooling process, the chamber 64D can be vented close to ambient pressure. The valve assembly at the upstream end can then be opened to allow the end effector 24 to remove the panel therefrom and place it within a storage cassette. Those of ordinary skill will also recognize that a combination conductive/convective cooling process can be employed.

During this panel cycling process, the loadlock assembly 60 is positioned at different vertical heights to align the panel aperture 114 with one of the loadlock slots. For example, the panel aperture 114 can be aligned with slot 126A of the flange 72. The valve 128 opens and the pickup arm accesses the chamber 62D and removes the panel therefrom. The pickup arm then moves the panel downstream in a scanning direction to process the panel. After the panel is implanted, the panel is returned to the loadlock 62D. Similar to that described above, the valve 128A is closed and the chamber is vented. The load bearing system then positions the loadlock assembly 60 at a different selected vertical position to allow the pickup arm to access another chamber. This system thus allows continuous cycling and processing of panels, which in turn significantly increases the throughput of the ion implantation system 10.

The illustrated ion implantation systems 10, 30 also allow the implantation process to be divided into multiple implant stages, each stage being separated by periods of cooling. The period of cooling can vary in order to allow the workpiece to be sufficiently cooled while it is located within a loadlock. High throughput in this ion implantation system can be maintained by processing workpieces in parallel. In particulars a workpiece 174 is constantly being processed within the process chamber 16 while other workpieces are being cooled within a particular loadlock or loaded and unloaded from the loadlock. The workpiece can thus be held within a loadlock for an indefinite period of time. After the holding period the workpiece can either be transferred back into the process chamber 16 for additional implantation, or the workpiece can be removed from the loadlock through the upstream entry valve.

The implantation system of the present invention provides for a number of unique and beneficial advantages. One advantage is the high throughput of the system which is provided for by the stacked loadlock assembly of the present invention. Another advantage is that the illustrated system allows multiple processing of panels by temporarily storing panels within the loadlock chambers 62D–70D. Thus, for example, after a panel is implanted, it can be stored within a loadlock chamber, cooled, and later retrieved for further processing.

Figure 9:
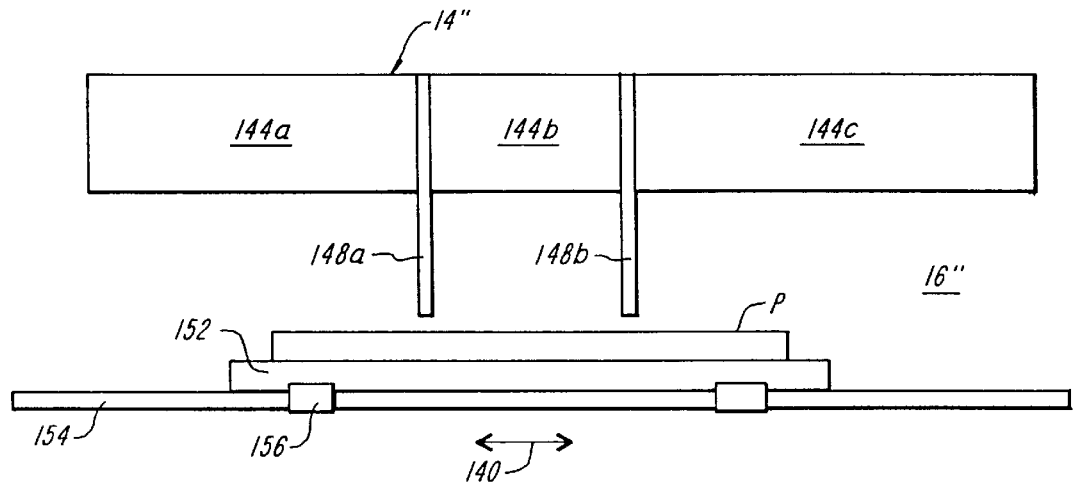
FIG. 9 schematically illustrates that multiple processes can be performed upon a single panel concurrently.

The system of the present invention further provides for multiple processes to be performed upon a single panel P. As illustrated in FIG. 9, the housing 14" can be configured to form one or more partitions 148A–148B along the process chamber. These partitions preferably divide the process chamber 16" into contiguous and serial process sections 144A, 144B and 144C which can be maintained at different pressures by suitable pumping assemblies. The illustrated panel P, which is secured to pickup arm 152, moves in the scanning direction represented by arrow 140 by the linear bearing and shaft assembly 154, 156. As the panel P moves in the scanning direction, it passes beneath the partitions 148A–148B and through each particular processing section. For example, section 144A can preheat the panel as it passes therethrough, section 144B can implant the panel, and section 144C can cool the panel. Thus, multiple processes can be performed upon the same panel nearly simultaneously in the same process environment. This serial processing technique allows multiple processes to be performed upon the same panel, thus reducing the overall processing time and increasing the throughput of the implantation system.

Figure 6:
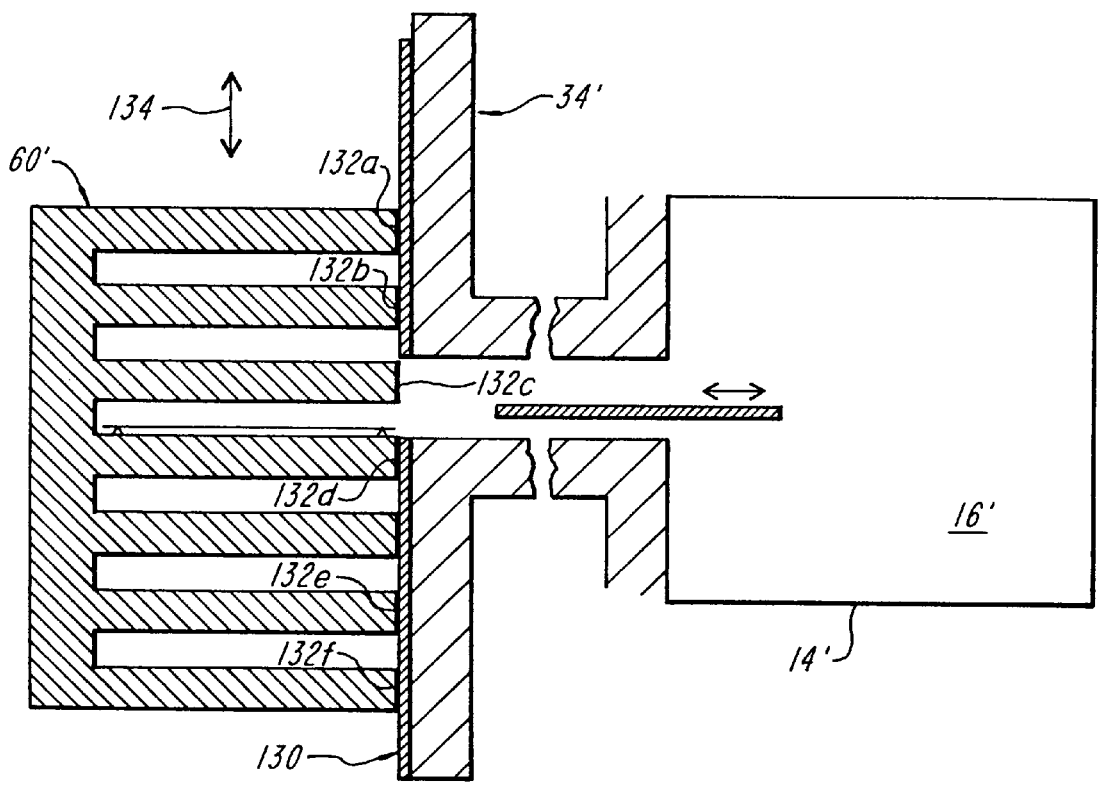
FIG. 6 is a cross-sectional view of an alternate embodiment of the sliding seal arrangement of the present invention.

FIG. 6 illustrates an alternate embodiment of the sliding seal arrangement of the present invention. In this illustrated embodiment, a strip of polyethylene sealing material 130 is affixed to the chamber wall 34' along its lateral face. This sealing material thus eliminates the need for providing the flange 72 which mounts to the loadlock assembly 60'. The front face of each loadlock further has mounted thereon a sealing material 132A–132F, such as a strip of high molecular weight polyethylene. Furthermore, the sliding surface 34' is formed as an extension of the process chamber 16' and of the housing 14'. The illustrated loadlock assembly 60' is vertically movable as by the linear bearing system of the present invention, as denoted by arrow 134.

Figure 7:
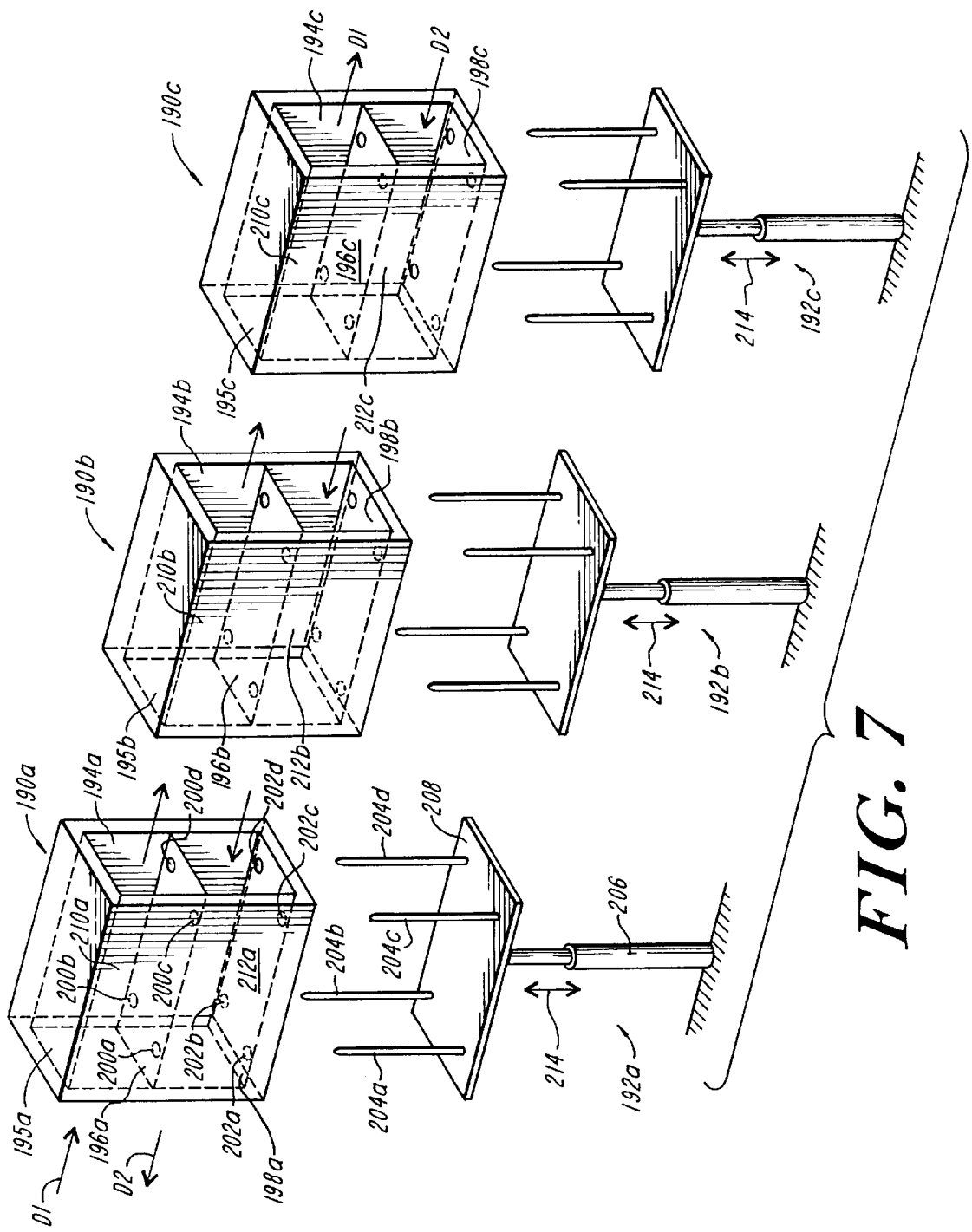
FIG. 7 shows a perspective view of the loadlock assembly of FIG. 1 in a serial configuration.

FIG. 7 shows a serial loadlock assembly formed of a plurality of loadlocks 190A, 190B, and 190C. The serial assembly also includes elevator assemblies 192A, 192B, and 192C positioned for acting upon the loadlocks 190A, 190B, and 190C, respectively.

Each of the loadlocks 190A, 190B, and 190C include exit valves 194A, 194B, and 194C for loading or unloading workpieces from an exit end of the loadlocks, respectively. The loadlocks 190A, 190B, and 190C can further include entry valves 195A, 195B, and 195C for loading or unloading workpieces from the entry end of the loadlocks, respectively.

Preferably, the loadlocks 190A and 190B are arranged so that a robot (not shown) can readily move a workpiece from loadlock 190A to loadlock 190B. For instance, the loadlocks 190A and 190B can be oriented so that the exit valve 194A of loadlock 190A is adjacent the entry valve 195B of loadlock 190B. A robot situated between the two loadlocks can then move a workpiece from loadlock 190A to loadlock 190B. Loadlock 190C is arranged with respect to loadlock 190B in an analogous fashion. This allows a serial chain of loadlocks, with robots spaced between the loadlocks, to be formed, as illustrated in FIG. 7. The serial chain provides significant throughput increases when processing the workpieces. In particular, different processes can be performed in the various loadlocks. This allows a plurality of workpieces to be undergoing various steps in the ion implantation sequence concurrently. For example, one loadlock may be loading or unloading workpieces from an external workpiece cassette, one loadlock may be cooling workpieces, and one loadlock may be loading or unloading workpieces from the process chamber 16.

According to a further aspect of the invention, each of the loadlocks 190A, 190B, and 190C can also include an upper chamber 210 and a lower chamber 212 divided by a separation plate 196. For example, loadlock 190A includes a separation plate 196A dividing the loadlock into an upper chamber 210A and a lower chamber 212A, loadlock 190B includes a separation plate 196B dividing the chamber into an upper chamber 210B and a lower chamber 212B, and loadlock 190C includes a separation plate 196C dividing the loadlock into an upper chamber 210C and a lower chamber 212C. Each chamber is sized to hold the workpiece 174, and thus each loadlock is sized to hold more than one vertically spaced apart workpiece. Accordingly, both the lower and upper chamber can concurrently hold workpieces.

Preferably, the loadlocks are arranged in a serial chain as described above, with workpieces that move along a direction D1 in the serial chain being loaded and unloaded from the upper chambers in each of the loadlocks and with workpieces that move along a direction D2 in the serial chain being loaded and unloaded from the lower chambers in each of the loadlocks. Accordingly, workpieces moving along direction D1 are found only in the upper chambers 210 and workpieces moving along direction D2 are found only in the lower chambers 212. This embodiment provides for a serial chain of loadlocks that does not require complicated robot arms between each loadlock that are capable of moving vertically as well as horizontally.

Elevator assemblies 192A, 192B, and 192C are utilized to aide the movement of a workpiece through loadlocks 190A, 190B, and 190C, respectively. Each elevator assembly comprises an actuator 206 capable of movement along the direction of axis 214. The elevators aid in the movement of the workpieces by providing structure capable of allowing a robot arm to easily load and unload workpieces from within the loadlocks 190.

In particular, the loadlocks 190 can further comprise a set of holes 200 placed in the separation plate 196 and a set of holes 202 placed in the lower plate 198. Furthermore, the elevator assemblies 192 can further include a plate 208 mounted to actuator 206, and a set of pins 204 mounted to the plate 208. The pins 204 are fixedly mounted to the plate 208 such that they are aligned with an equal number of holes 200 and an equal number of holes 202. Preferably, in accordance with this embodiment, actuator 206 is a three position actuator that places the pins 204 either above the level of separation plate 196, above the level of lower plate 198, or below both of the plates 196 and 198.

Accordingly, when the elevator is properly aligned with a loadlock, the elevator aids in the loading and unloading of a workpiece from the particular loadlock by lifting a workpiece off of or by lowering a workpiece onto either the separation plate 196 or the lower plate 198. For example, as the elevator assembly 192A is activated the pins 204A–204D move along direction 214. When the elevator 192A is properly aligned with loadlock 190A and the elevator is raised, the pins 204A–204D will first pass through holes 202A–202D and then through holes 200A–200D. The movement of the pins through the holes provides a force for lifting and lowering a workpiece placed upon separation plate 196 and upon lower plate 198.

In operation, a workpiece entering a lower chamber 212A of loadlock 190A from along direction D2 is first moved into the lower chamber 212A by a robot arm (not shown). Pins 204A–204D are inserted through holes 202A–202D such that a workpiece placed within chamber 212A rests upon the pins 204A–204D rather than upon the surface 198A. Once the workpiece is moved into the chamber 212A and placed upon the pins 204A–204D the elevator assembly 192A lowers the pins 204A–204D, thereby allowing the workpiece to rest upon surface 198A. This advantageously allows a workpiece to be inserted into a loadlock 190A and be cooled once it is lowered upon the lower plate 198A. Cooling of the workpiece by the loadlock 190A can occur through processes described above, such as convection cooling by direct contact of the workpiece with the lower plate 212A.

When the plate is to be moved out of the loadlock along direction D2, the pins 204A–204D are inserted through the holes 202A–202D to raise the workpiece above the level of surface 2198A. Once the workpiece is raised above the level of surface 198A a robot arm can be inserted into the chamber 212A to remove the workpiece.

An analogous process is used to insert and remove a workpiece from chamber 210A. For example, a workpiece to be inserted into chamber 210A along direction D1 is moved into the chamber 210A by a robot arm. Pins 204A–204D are inserted through holes 200A–200D to provide a support for the workpiece. Once the workpiece has been positioned and is resting upon the pins 204A–204D the pins can be lowered through holes 200A–200D to allow the workpiece to rest upon surface 196A. When the workpiece is to be removed from loadlock 190A the pins 204A–204D are once again inserted into holes 200A–200D thereby raising the workpiece above the surface 196A. This allows a robot arm to be inserted into the chamber 210A between the workpiece and the surface 196A, thereby allowing the robot arm to extract the workpiece from loadlock 190A.

Figure 8:
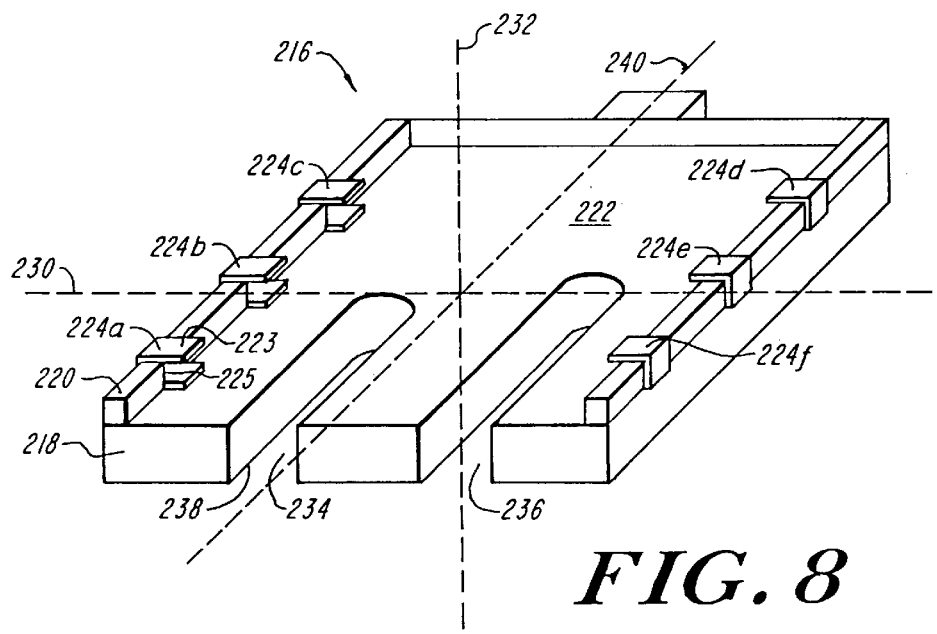
FIG. 8 illustrates a detailed view in perspective of the pick up arm of the workpiece handling assembly of FIG. 1.

FIG. 8 illustrates a pickup arm 216 that can be used to translate the workpiece throughout the ion implantation system 10 or 30. In particular, the pickup arm 216 is preferably used to move the workpiece from the loadlock assembly 12 into the process chamber 16. In addition, the pickup arm 216 can be utilized to hold the workpiece and translate the workpiece as it passes through the system.

The pickup arm is formed of a main body 218 having a raised edge on three sides that forms a perimeter wall 220. Accordingly, the pickup arm 216 contains a surface 222 that is recessed relative to the perimeter wall 220. The recessed surface 222 and the wall 220 are shaped to provide a space for securing the workpiece.

The illustrated pickup arm 216 can include clamps 224A–224F for securing a workpiece to the pickup arm 216. The clamps 224A–224F each contain an upper flange 223 for applying a force to the workpiece that opposes the force generated by the recessed surface 222. In particular, the upper flange 223 in conjunction with the recessed surface 222 pinches the workpiece so as to secure it in place. The clamps 224 can move along the direction of the first axis 230 to allow engagement and disengagement from the workpiece. In addition, the movement of the clamps along the first axis 230 allows for the clamps to secure a workpiece to the pickup arm 216 regardless of the size of the workpiece. One example of such clamps are spring loaded clamps.

The illustrated clamps are also configured for movement along axis 232 in order to vary the securing force applied by the clamps to the workpiece. The securing force is advantageously varied in order to generate a force sufficient to hold the workpiece in place, yet not so strong as to damage the workpiece. In order to achieve the proper securing force, either the upper flange 223 or the lower flange can be varied along the direction of axis 232.

In order to overcome the difficulties in securing a workpiece that is slightly warped, i.e. varies from a horizontal plane, the clamps 224A–224F can be varied independently. In those cases where the workpiece tends to rise above the surface 222, the flanges 223 and 225 can be raised in height relative to the surface 222 and apply a force to either side of the workpiece thereby securing the workpiece.

With further reference to FIG. 8, the pickup arm 216 can include a first channel 234 and a second channel 236 that runs through the surface 222. The channel runs through the pickup arm from surface 222 to a bottom surface 238 of the pickup arm 216. Accordingly, the pickup arm forms a three-pronged structure. The channels 234 and 236 provide access to the bottom of a workpiece resting upon surface 222.

In operation, the pickup arm 216 is inserted into a loadlock containing a workpiece. Typically the workpiece will be raised from the surface of the loadlock by the use of pins 204. As the pickup arm 216 is inserted into the loadlock, the pickup arm 216 is aligned such that the pins 204 pass along the channels 234 and 236. This allows the pickup arm to be positioned below the workpiece which is simultaneously being supported by the pins 204. In addition, at this point in time, the clamps 224 are fully retracted to allow the workpiece a higher degree of freedom of movement within the pickup arm 216.

Once the pickup arm is positioned, the pins 204 can be lowered thereby allowing the workpiece to come to rest on a recessed surface 222. After the workpiece has come to rest on the surface 222 of the pickup arm the clamps 224 can be engaged. After the workpiece has been securely mounted to the pickup arm 216, the pickup arm is removed from the loadlock with the workpiece.

The pickup arm detailed above has the further advantage of being able to hold the workpiece to the pickup arm while the pickup arm is rotated about a third axis 240. This allows the workpiece secured to the pickup arm to be positioned under an ion source 18.

FIGS. 10 through 13 illustrate another embodiment of the ion implantation system of the present invention. The illustrated ion implantation system 300 includes, from the input loading end of the implantation system to the processing end (e.g., right to left in FIGS. 10 and 11), a plurality of conventional panel cassettes 302 which store a number of flat panels. An end effector 306 is positioned so as to retrieve a panel from a selected cassette 302 and to place the panel in one of the loadlock chambers of the loadlock assembly 310. The end effector 306 includes a pair of hinged arms 306A that are coupled to a support bracket 306B that terminates in a panel support table 306C. The end effector 306 is pivotable about a base 307 that translates along axis 311 to allow the end effector 306 to access and retrieve panels stored in either cassette 302. The end effector arms 306A, 306A are hinged about fulcrum 306D, 306D and are extendible so as to move the support table 306C into and out of the panel cassettes. The end effector is also pivotable about base 307 to allow the support table 306C to insert or retrieve a panel from the loadlock assembly 310.

The end effector 306 is also vertically movable, as indicated in phantom in FIG. 1, to allow the effector to access panels along the entire vertical height of the panel cassettes 302, 302. The illustrated end effector is known in the art, and need not be described further herein.

At the input end of the loadlock assembly 310 is formed an input gate valve 312, which is selectively actuatable by a controller according to a user-defined sequence. An output gate valve 314 is formed at the opposite end of the loadlock assembly 310 and is in fluid communication with the loadlock assembly and with the process chamber 318 contained within the process housing 316. The illustrated process chamber 318 mounts a single workpiece handling assembly 320, FIG. 12. The illustrated workpiece handling assembly 320 performs a dual function of loading and unloading panels from the loadlock assembly 310 and for supporting the panel during processing. Specifically, the workpiece handling assembly 320 supports the panel and translates the panel in a scanning direction past the ion source 330, which generates an ion beam of prescribed energy. When the workpiece handling assembly 320 translates the panel through the ion beam, the panel is implanted by the energetic ions contained within the beam.

The ion source 330 mounts to one side of the process housing 316, and preferably to the side of the housing located opposite the wall mounting the loadlock assembly 310. The illustrated ion implantation system 300 further includes a gas box 332 which encloses a portion of the ion source, including an RF matching circuit 330A. As is known in the art, the ion source 330 is surrounded by one or more high voltage bushings 330B which function as an insulator for the high voltage source for powering the ion source 330. A generator 334 is coupled at one end to the gas box 332, and at another end to motor 336. The loadlock assembly 310 and the process chamber 18 can be disposed at selected pressure levels by the pump-down assembly 319, which includes pressure conduits 319A and a pump source. The controller for controlling the operation of the system components can be housed in the facility box 321. Peripheral electronics typically employed during use of the system 300 can be housed in various locations, including the electronics rack 323. Any particular exhaust generated during the implantation procedure can be exhausted from the enclosure 325 via exhaust conduits 327. Those of ordinary skill will recognize the function and operation of the conventional portions of the ion implantation system, which include the ion source 330, gas box 332, generator 334 and motor 336, and need not be described further herein.

Figure 12:
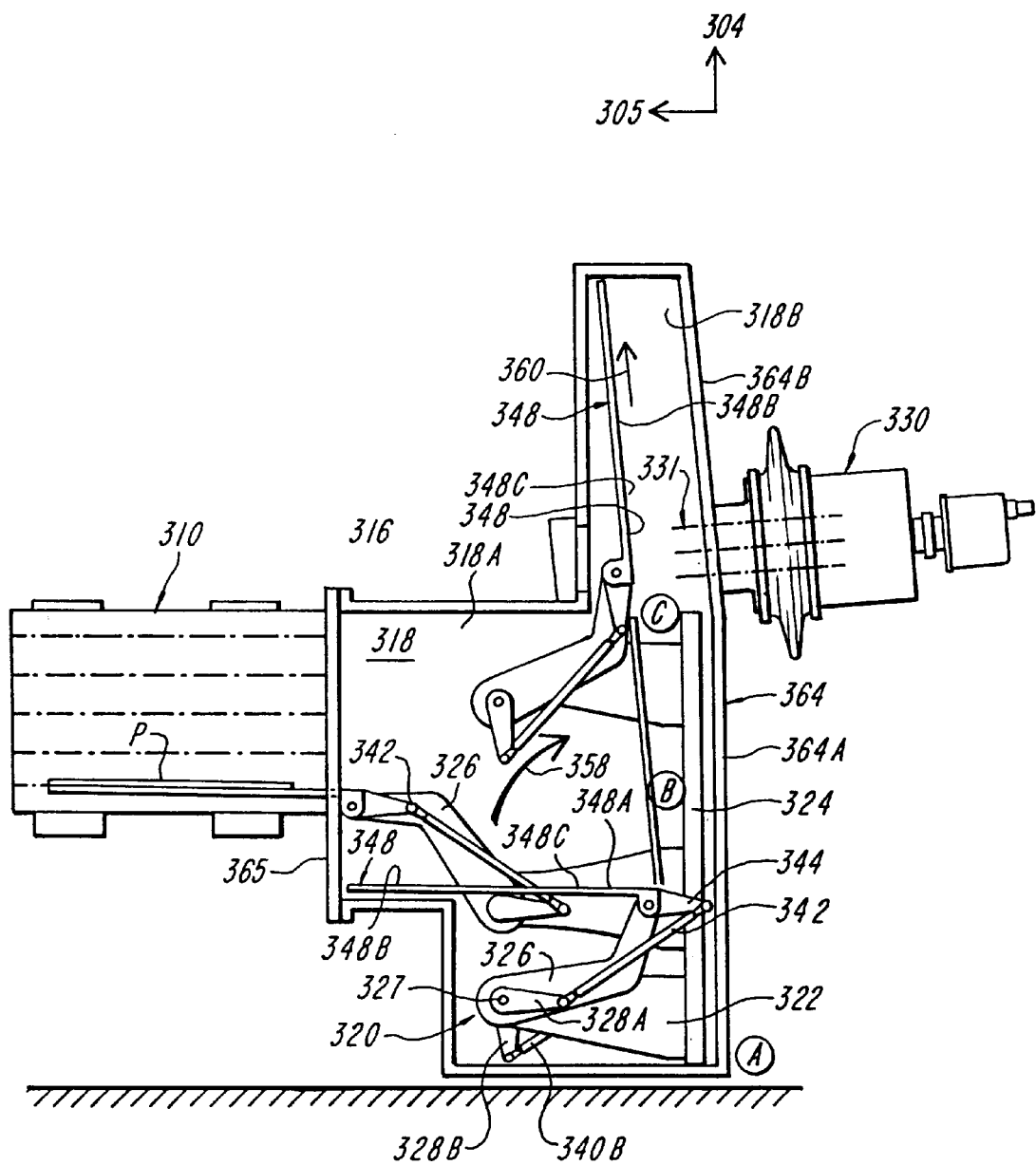
FIG. 12 is a schematic cross-sectional view of the process housing and chamber of the ion implantation system of FIG. 10 illustrating the panel handling assembly of the present invention.
Figure 13:
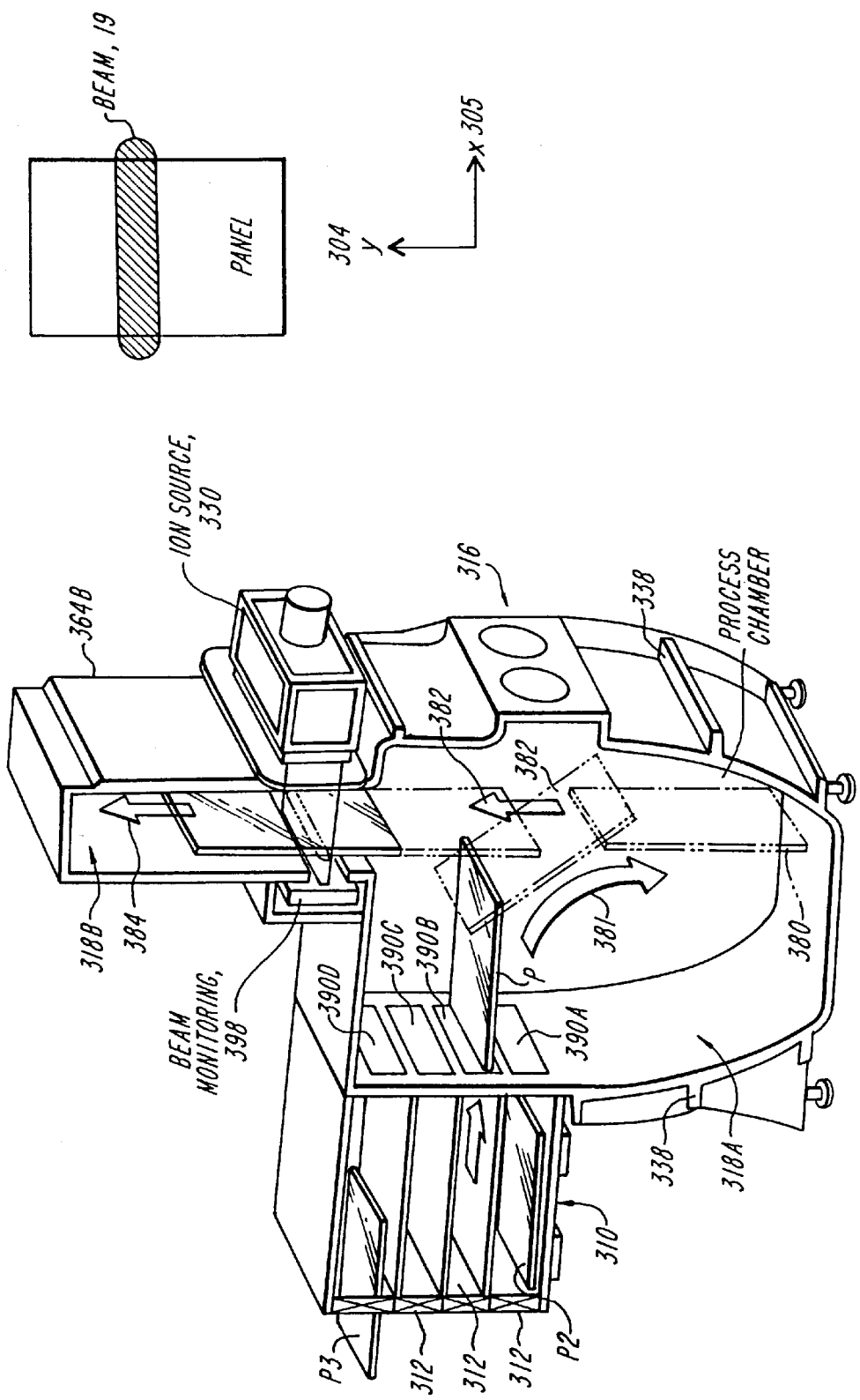
FIG. 13 is an exemplary perspective view, partly broken away, of the process chamber and housing of the ion implantation system of FIGS. 10–12 illustrating the panel movement while processing multiple panels according to the teachings of the present invention.

FIGS. 12 and 13 illustrate the workpiece handling assembly 320 mounted within the process chamber 318 of the process housing 316. The illustrated process housing 316 has formed along an outer surface a number of structural webs 338 which provide rigid mechanical support for the process housing, and thus help maintain the mechanical integrity of the system 300.

The ion source 330 is mounted to an outer wall 364 of the process housing 316. The outer wall 364 preferably includes a first substantially vertical wall portion 364A, which extends along axis 304, and a second canted upper wall portion 364B which mounts the ion source 330. The illustrated surface 364B is preferably offset from the vertical axis 304 by a selected amount, which is preferably equal to the offset between the platen 348 of the workpiece handling assembly from the axis 304 when disposed in its most vertical position, as described further below. By forming the canted surface 364B of the process housing 316 at an angle substantially equal to the angle between the platen and the vertical axis 304 during scanning, the system ensures that the platen surface will be substantially parallel to the ion source, and thus perpendicular to the ion beam 331 that is emitted from the ion source 330. This creates a substantially uniform implant of the panel.

The process chamber 318 includes a first chamber portion 318A and a substantially vertically extending chamber portion 318B. The chamber portion 318A is sized to accommodate removal of the panel P from one of the loadlock chambers of the loadlock assembly 310. The other vertically extending chamber portion is preferably smaller and is sized to accommodate transverse scanning of the panel in the scanning direction 360, while concomitantly reducing the total chamber volume to relax the pumping constraints of the process chamber, e.g., allow faster evacuation of the chamber. The chamber portion 318B also extends far enough in a direction transverse, or even orthogonal, to axis 305 to allow the panel to pass completely by the ion beam 331.

The loadlock assembly 310 is mounted to another wall 365 of the process housing 316, preferably opposite the wall 364 mounting the ion source 330. The illustrated loadlock assembly 310 is fixedly mounted to the housing wall 365 and overlies a series of vertically aligned slots 390A–390D that are in registration with the openings of the loadlock assembly 310. These openings preferably open onto the loadlock chambers of each loadlock in the loadlock assembly 310. The loadlock assembly is preferably similar to the stackable and nestable loadlock assembly 60 of FIGS. 1A–6.

The illustrated loadlock assembly preferably includes output gate valves 314 that selectively close each one of the openings of the loadlock chamber. The operation of the output gate valves is known in the art. The loadlock assembly 310 is also sealingly coupled to the wall 365 of the housing 316 to maintain a relatively pressure-tight and fluid-tight seal.

With further reference to FIG. 12, the illustrated workpiece handling assembly 320 includes a number of pivotable components which effectuate the loading and unloading of the panel from the loadlock assembly 310, as well as to tilt or orient the panel in a substantially vertical orientation to translate the panel therealong during processing. The workpiece handling assembly 320 includes a vertical carriage 322 that is operatively coupled to a vertically extending guide rail 324, e.g., extends along axis 304. The illustrated guide rail 324 includes a groove which seats the vertical carriage 322. The vertical carriage and guide rail are preferably coupled to a driving mechanism, such as a linear drive motor or lead screw, which selectively and variably moves the carriage along the guide rail 324 along axis 304. A support arm 326 is pivotally attached to the vertical carriage 322 at a pivot point 327. Also attached to this pivot point is a pair of altitude control arms 328A and 328B. The altitude control arms are each coupled to an altitude control link 340A and 340B, respectively. As shown, a first end of the control link 340A is coupled to one end of the control arm 328A, the opposite end of which is coupled to the pivot point 327. The opposite end of the control link 340A is pivotally coupled to pivot point 342 and to an intermediate support arm 344. The intermediate support arm 344 terminates at an end opposite the pivot point 342 at a pivot point which has attached thereto the platen 348. The platen includes a first face 348A and a second recessed face 348B to form a lip 348C therebetween. The lip is sized to mate with one end of a panel P, and serves to hold or support the panel on the platen 348 during processing, as described further below.

The illustrated altitude control links 340a, 340b are each operatively coupled to a drive mechanism, such as a linear motor, drive screw or other types of driving structures. The drive mechanisms in conjunction with the components of the workpiece handling assembly 320 provide structure for removing a panel P from one of the loadlock constituents of the loadlock assembly 310, and to translate the panel in a scanning direction designated by arrow 360 past the ion source 330.

In operation, the end effector 306 removes a panel from one of the panel cassettes 302. A controller then opens the upstream (input) gate valve 312 to allow the end effector 306 to place the panel P within one of the loadlocks of the loadlock assembly 310. The end effector, according to a user-defined sequence, further loads panels or removes panels from a particular loadlock. This user-defined sequence allows the ion implantation system 300 to process multiple workpieces concurrently to effectuate a high throughput ion implantation system. For simplicity, the loading and implantation of a single panel will be described further below, but those of ordinary skill will readily recognize that additional panels can be loaded in the loadlock during the implantation step, or other panels can reside in one of the remaining loadlocks where it undergoes further processing, such as cooling.

Once a panel P has been loaded in a selected loadlock, the workpiece handling assembly 320 removes the panel P and holds the panel during implantation. According to one sequence, the vertical carriage 322 is moved from position A vertically upward along guardrail 324 to a second vertical position B. When the handling assembly is disposed at position B, the altitude control link 340A pivots about pivot point 342 to move the platen 348 into a loadlock chamber, such as chamber 354. The panel residing within the chamber 354 is preferably vertically spaced from the floor of the chamber to allow the platen 348 to slide beneath the panel to remove it from the chamber 354. When the platen 348 is slid beneath the panel P, the end of the panel closest the process chamber 318 contacts the lip 348C of the platen.

The panel P is removed from the chamber of the loadlock 354 by actuating the control link 340A to pivot about the pivot point 342, while concomitantly actuating the vertical carriage 322 to move vertically downward along the guiderail 324 to a position the same as or close to position A. The altitude control arms and links 328A, 328B, 348, 340B are then operatively controlled to move about pivot points 327 and 342 to swing the platen in a direction illustrated by arrow 358 to tilt the workpiece relative to the horizontal plane of the implantation system 300. According to a preferred embodiment, the workpiece handling assembly tilts the platen surface 348A relative to the axis 304 to form an angle therebetween that is greater than zero degrees, and is preferably greater than 5 degrees. According to a most preferred embodiment, the platen surface and the axis 304 form an angle of about 5 degrees. This specific orientation allows gravity to hold the panel on the platen.

The vertical carriage 322 is then moved vertically upward to position C, and the illustrated pivotable components of the workpiece handling assembly 320 are adjusted to translate the platen surface in the scanning direction denoted by arrow 360. During this scanning motion, the vertical carriage 322 and the pivoting components of the workpiece handling assembly maintain the same degree of separation between the platen surface and the chamber wall 364B. That is, the scanning direction 360 is substantially parallel to the wall 364B. This constant separation between the panel and wall 364B during processing ensures a uniform implant of the workpiece. The workpiece handling assembly then reverses the motion of the panel to place the implanted workpiece into one of the loadlock chambers.

During the implantation process, a portion of the ribbon beam 19 spills over the edge of the panel P. A beam monitoring apparatus 398 can be housed within the chamber 318, or can be coupled to the process housing 316 and communicate with the chamber 316, to analyze the ion beam 19, 331. The monitoring apparatus further enables the ion implantation system of the invention to achieve increased throughput by measuring the parameters of the ion beam 331 while contemporaneously treating/implanting the workpiece with the ion beam. The term parameters refers to those characteristics of the ion beam relevant to the implantation of ions in a workpiece, such as the current density of the ion beam, the number of neutral particles in the ion beam, and the mass of particles in the ion beam. In comparison to prior art techniques that intermittently measured the current density of the ion beam between the implantation of a predetermined number of workpieces, the beam monitoring apparatus takes measurements of the ion beam during the implantation of the workpiece. Accordingly, the ion beam can be constantly monitored during the implantation process without interrupting the implantation process to obtain ion beam measurements.

The illustrated ribbon beam 19 that extends along an axis of elongation and has a width that extends along a second path transverse to the elongation axis. The ribbon beam can be formed from an elongated slot in a plasma electrode of the ion source having a high aspect ratio, that is a ribbon beam having a length that exceeds the width by fifty (50) times or more. Ribbon beams prove effective in implanting large area workpieces because they can reduce the number of passes of the workpiece through the ion beam required to obtain a preselected dosage. For example, prior art techniques required that the ion beam be scanned in two orthogonal directions over the workpiece to completely cover the workpiece. In comparison, when a ribbon beam has a length that exceeds at least one dimension of the workpiece, only one scan of the workpiece through the ribbon beam is required to completely cover the workpiece.

Ribbon beams formed from electrode slots having even higher aspect ratios of 100:1 prove useful in implanting larger workpieces, such as workpieces having dimensions of 550 mm by 650 mm and larger. These ribbon beams, however, are more difficult to control and to keep uniform. Accordingly, continuous measurement and control of the parameters of the ion beam prove to be particularly important when using ribbon beams formed from electrode slots having high aspect ratios. The preferred ion beam monitoring apparatus is set forth in Attorney Docket No. ETE-003, the teachings of which were previously incorporated by reference.

The multiple processing of panels by the ion implantation system 300 is schematically illustrated in FIG. 13. The panel P removed from the loadlock 372 is moved in the direction indicated by arrow 374. Upon removal of the panel P from the loadlock 372, the workpiece handling assembly 320 tilts the platen surface, and thus the panel, in a direction transverse to the substantially horizontal direction from which the panel P is removed from the loadlock. Specifically, the panel P is disposed in a first transverse position 378 and is then moved vertically downward along axis 304 and disposed in a further vertical position 380, as indicated by arrow 381. The workpiece handling assembly 320 then moves the panel upwardly in the translation direction, as indicated by arrows 382 and 384.

While the illustrated panel is being implanted, another panel P2 is loaded in an adjacent loadlock, where either it awaits processing, or is cooled via the cooling system of the ion implantation system, such as the cooling system associated with the loadlock assembly of FIGS. 1A–6. Additionally, a further panel P3 can be loaded into another loadlock of the loadlock assembly 310.

The ion implantation system 300 of the present invention has a number of beneficial advantages. One advantage of the present ion implantation system is that it employs a single workpiece handling assembly to both load an implanted panel into and remove a panel from the loadlock assembly 310, while concomitantly supporting the panel during translation along the scanning direction. The use of a single workpiece handling assembly to both manipulate a panel and to support it during implantation reduces the number of mechanical units which must be mounted within the process chamber, as well as reduces the number of mechanical transfers of the panel during processing relative to prior art ion implantation systems. For example, prior art systems employed a first robotic arm to remove a panel from a loadlock and to load the panel on a separate translating stage. The translating stage then moves the panel in the scanning direction where it is implanted by the ion source. By integrating these components into a single workpiece handling assembly, the number of workpiece transfers is reduced, thus increasing the throughput of the implantation system.

Figure 10:
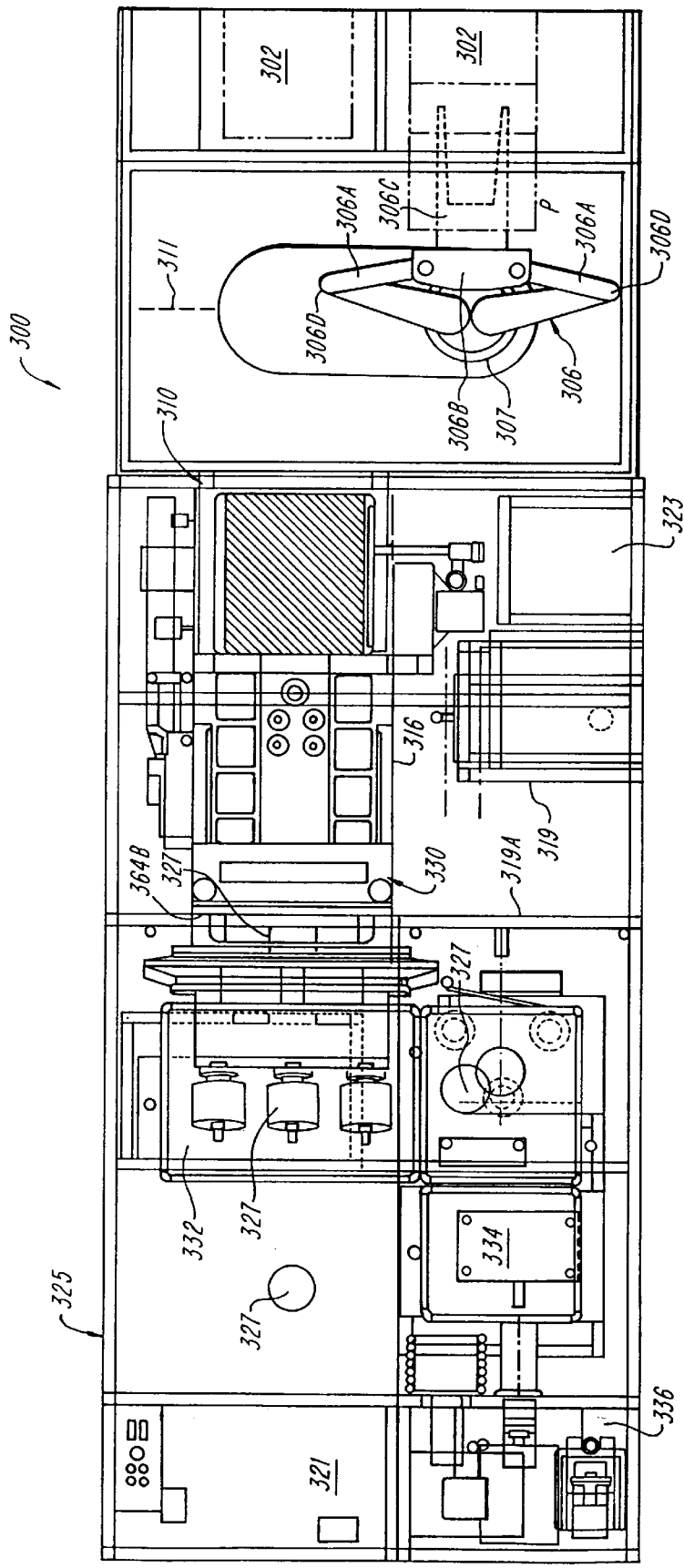
FIG. 10 is a top view of another embodiment of the ion implantation system according to the teachings of the present invention.
Figure 11:
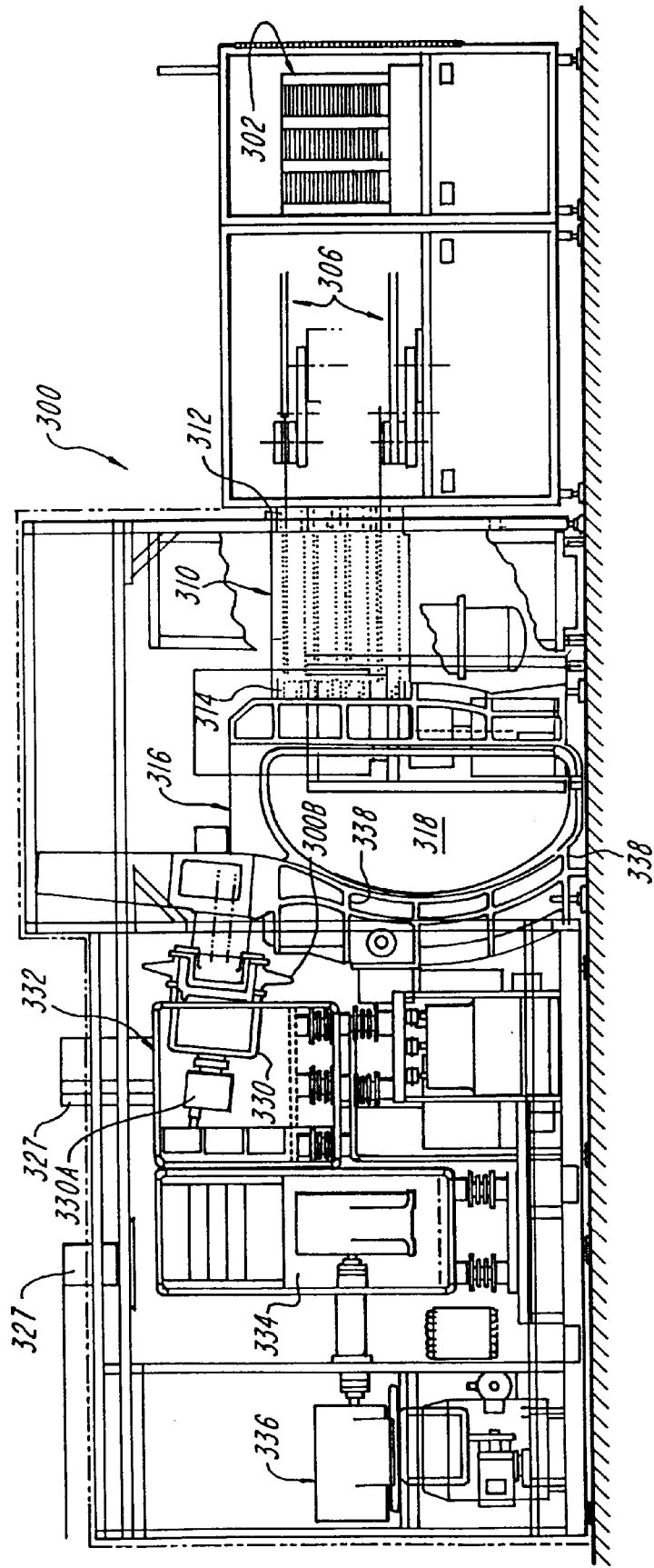
FIG. 11 is a side perspective view of the ion implantation system of FIG. 10.

Another advantage of the present invention is that the workpiece handling assembly 320 translates the panel in a vertical scanning direction, where it is implanted by the ion source 330. Constructing the process housing such that it accommodates movement of the panel in a vertical scanning direction, reduces the overall size and footprint of the housing. This results in a reduced overall footprint for the ion implantation system 300. For example, the process housing has a horizontal footprint of less than about 60 inches along axis 304, and has a vertical height of about 102 inches. The dimensions of the complete ion implantation system illustrated in FIGS. 10 and 11 is approximately 197 inches long and 92 inches wide. Those of ordinary school will recognize that incorporating the end effector and panel cassettes will add to the overall dimensions of the ion implantation system, and according to a preferred embodiment, these dimensions are about 290 inches long and about 89 inches wide.

Figure 14:
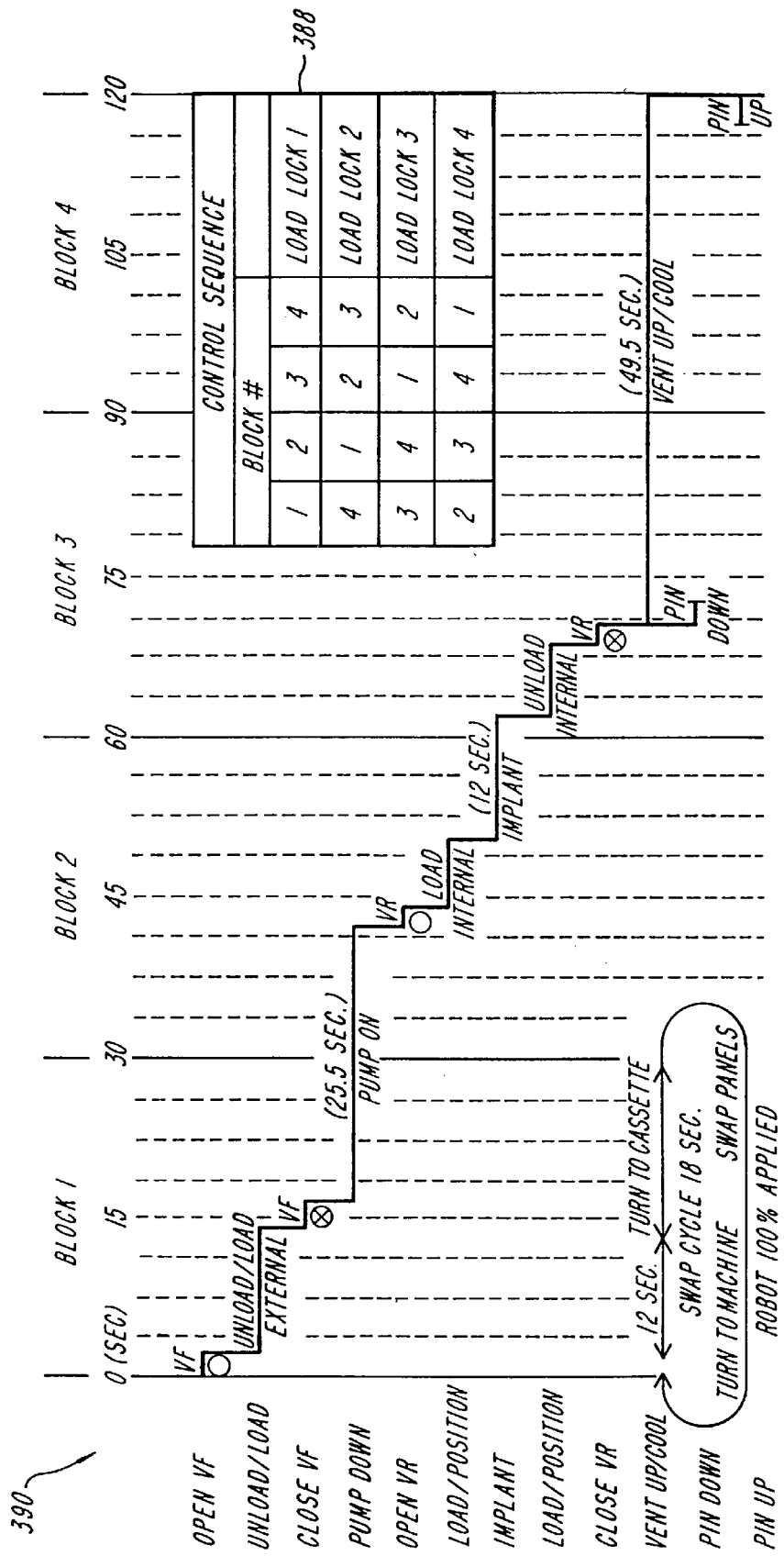
FIG. 14 is a schematic timing diagram illustrating the particular events which the ion implantation system of FIG. 10 undergoes when processing multiple panels in the stacked loadlock array of FIGS. 3A–4C.

The concurrent processing of multiple panels is further illustrated by the control sequence timing diagram of FIG. 14. The timing diagram graphically illustrates the events that occur for various loadlocks of the loadlock assembly 310 during the processing of multiple panels. The control sequence table 388 illustrates the particular sequences that occur within the loadlocks of the loadlock assembly 310, designated as loadlock 1, loadlock 2, loadlock 3, and loadlock 4. The sequence numbers 1–4 correspond to particular operational events which occur during the timing sequence illustrated by the timing diagram 390. For example, block 1 corresponds to the operational events that occur between about 0 and 30 seconds, block 2 corresponds to the operational events that occur between about 30 and 60 seconds, block 3 corresponds to the operational events that occur between about 60 and 90 seconds, and block 4 corresponds to the operational events that occur between about 90 and 120 seconds. The operational events that occur during blocks 1–4 are listed under the event heading at the left-most portion of the timing diagram 390. One example of an event timing sequence is as follows. At time 0, the following events occur the front gate valve VF, which is typically adjacent the end effector of the ion implantation system, is opened by any suitable controller, such as a general purpose computer. After the gate valve VF is opened, a panel is loaded therein by the end effector 306. Once the panel is loaded within the loadlock chamber, the valve VF is closed and the chamber is pumped down by any suitable pumping assembly. As illustrated, the pump down of the loadlock takes about 25.5 seconds to complete.

Upon completion of the pump down of the loadlock, the downstream gate valve VR is opened and the workpiece handling assembly 320 removes the panel from the loadlock and translates it in the scanning direction to be implanted by the ion source. The implant portion of this timing sequence takes about 12 seconds to complete. The workpiece handling assembly is then positioned to unload the panel within the loadlock chamber. The gate valve VR is then closed and the loadlock chamber is then vented up to an appropriate pressure, such as atmospheric or any intermediate pressure. Furthermore, during the venting portion of the timing sequence, the heated panel is cooled according to the techniques described herein. As part of the vent/cool timing sequence which spans between blocks 3 and 4 of the timing sequence, and which takes approximately 49.5 seconds, the workpiece-support assembly mounted within the loadlock chamber is vertically moved between its deployed position where an implanted panel can be loaded thereon, and the stowed position where the implanted panel can be placed in intimate facing contact with the relatively cool floor of the loadlock.

The control sequence table 388 thus illustrates that different stages of the timing sequence occur at different loadlocks. The events that occur for a particular panel associated with a particular loadlock can thus be manipulated to facilitate the concurrent processing of multiple panels. According to a preferred practice, approximately 80 panels per hour can be processed by the ion implantation system 300 of the present invention.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

Having described the invention, what is claimed as new and desired to be secured by Letters Patent is:

1. A method for implanting a workpiece with an ion source, comprising the steps of:
   providing a processing chamber,
   providing a loadlock assembly having at least one loadlock chamber separate from and located outside of said processing chamber,
   moving only said loadlock assembly into substantially pressure-tight communication with said processing chamber,
   moving the workpiece from the loadlock chamber into the separate processing chamber,
   while in the processing chamber, implanting the workpiece with the ion source, and
   removing the workpiece from the processing chamber into the loadlock chamber.

2. The method of claim 1, further comprising the step of cooling the workpiece when resident within the loadlock chamber.

3. The method of claim 1, further comprising the step of repeating the steps of moving the workpiece and implanting the workpiece until the entire workpiece is implanted.

4. The method of claim 1, further comprising the step of applying a pressure to one side of the workpiece with a vacuum network when resident within the loadlock chamber to effect cooling thereof.

5. The method of claim 1, further comprising the step of drawing the workpiece into relatively close proximity with a cooling surface of the loadlock chamber to effect heat transfer between the workpiece and the cooling surface.

6. The method of claim 5, further comprising the step of circulating a cooling fluid through the cooling surface.

7. The method of claim 1, further comprising the step of controlling the pressure within the loadlock chamber so as to define a gap between the workpiece and a cooling surface of the loadlock to ensure that the heat transfer between the cooling surface and the workpiece is predominantly conductive.

8. The method of claim 1, further comprising the step of disposing the loadlock chamber at a selected pressure to create a force on the workpiece to place the workpiece in close proximity to a cooling surface within the loadlock chamber.

9. The method of claim 1, further comprising the steps of
   positioning the workpiece within the loadlock chamber and relative to a cooling surface of the loadlock chamber to form a gap between the workpiece and the cooling surface, and
   disposing the loadlock chamber at a pressure between about 35 Torr and about 760 Torr, such that the gap beneath the workpiece is disposed at a pressure between about 20 Torr and about 745 Torr, thereby forming a net force on the workpiece that draws the workpiece toward the cooling surface.

10. The method of claim 1, further comprising the step of allowing passage of a mechanical lift assembly into the loadlock chamber to act upon the workpiece.

11. The method of claim 1, further comprising the step of placing the workpiece back into the processing chamber from the loadlock chamber for further implantation.

12. A method for implanting a workpiece with an ion source, comprising the steps of:
    providing a processing chamber,
    providing a loadlock assembly having at least one loadlock chamber separate from and located outside of said processing chamber,
    moving only said loadlock assembly into substantially pressure-tight communication with said processing chamber,
    placing the workpiece into a loadlock chamber,
    moving the workpiece between the loadlock chamber and the separate processing chamber,
    implanting the workpiece when disposed in the processing chamber, and
    removing the workpiece from the processing chamber for placement within one of said at least one loadlock chamber.

13. The method of claim 12, further comprising the step of cooling the workpiece when resident within the loadlock chamber.

14. The method of claim 12, further comprising the step of applying a pressure to one side of the workpiece with a vacuum network when resident within the loadlock chamber to effect cooling thereof.

15. The method of claim 12, further comprising the step of controlling the pressure within the loadlock chamber so as to define a gap between the workpiece and the cooling surface to ensure that the heat transfer between the cooling surface and the workpiece is predominantly conductive.

16. The method of claim 12, further comprising the steps of
    positioning the workpiece within the loadlock chamber and relative to a cooling surface of the loadlock chamber to form a gap between the workpiece and the cooling surface, and
    disposing the loadlock chamber at a pressure between about 35 Torr and about 760 Torr, such that the gap beneath the workpiece is disposed at a pressure between about 20 Torr and about 745 Torr, thereby forming a net force on the workpiece that draws the workpiece toward the cooling surface.

17. The method of claim 12, further comprising the steps of
    positioning the workpiece within the loadlock chamber, and
    forming a net force on the workpiece that draws the workpiece toward a cooling surface of the loadlock chamber to cool the workpiece.

18. The method of claim 12, further comprising the step of repeating the transfer of the same workpiece between one of the loadlock chambers and the process chamber a selected number of additional times to further implant the workpiece.

19. A method for implanting a plurality of workpieces with an ion source, comprising the steps of:
  providing a processing chamber,
  providing a loadlock assembly, having a plurality of loadlock chambers separate from and located outside of said processing chamber,
  moving only said loadlock assembly into substantially pressure-tight communication with said processing chamber,
  bringing a selected one of said plurality of loadlock chambers into fluid communication with the separate processing chamber, wherein each of said plurality of loadlock chambers is sized for containing at least one workpiece,
  transferring one of the plurality of workpieces from the selected loadlock chamber to the processing chamber,
  implanting the workpiece with an ion beam,
  transferring the workpiece back to the selected loadlock chamber, and
  repeating the above steps until at least one workpiece has been implanted more than one time.

20. A method for implanting a plurality of workpieces with an ion source according to claim 19, comprising the further step of:
  disposing the selected load lock chamber at a selected pressure prior to bringing the selected loadlock chamber into fluid communication with the processing chamber.

21. A method for implanting a plurality of workpieces with an ion source according to claim 19, comprising the further step of:
  equalizing the pressure between the selected loadlock chamber and the processing chamber prior to bringing the selected loadlock chamber into fluid communication with the processing chamber.

22. A method for implanting a plurality of workpieces with an ion source according to claim 19, comprising the further step of:
  cooling the workpiece inside of the selected loadlock chamber subsequent to transferring the workpiece back to the selected loadlock chamber.

23. A method for implanting a plurality of workpieces with an ion source according to claim 19, comprising the further step of:
  suspending the workpiece inside of the selected loadlock chamber subsequent to transferring the workpiece back to the selected loadlock chamber to effect cooling of the workpiece by convection.

24. A method for implanting a plurality of workpieces with an ion source according to claim 19, comprising the further steps of:
  disposing a surface inside of the selected loadlock chamber at a selected temperature, and
  bringing the workpiece into contact with the surface subsequent to transferring the workpiece back to the selected loadlock chamber to effect cooling of the workpiece by conduction.

25. A method for implanting a plurality of workpieces with an ion source according to claim 24, comprising the further step of:
  circulating a cooling fluid through the surface to dispose the surface at the selected temperature.

26. A method for implanting a plurality of workpieces with an ion source according to claim 19, comprising the further steps of:
  coupling a vacuum network to a surface inside of the selected loadlock chamber, and
  employing the vacuum network to draw the workpiece into contact with the surface subsequent to transferring the workpiece back to the selected loadlock chamber to effect cooling of the workpiece by conduction.

27. A method for implanting a plurality of workpieces with an ion source according to claim 19, comprising the further step of:
  monitoring implantation parameters of the ion source contemporaneously with implanting the workpiece.

28. A method for implanting a plurality of workpieces with an ion source according to claim 27, wherein the monitoring step includes monitoring at least one of:
  current density of the ion source, number of neutral particles in the ion source, and mass of particles in the ion source.

29. A method for multi-processing a workpiece, comprising the steps of:
  moving a workpiece from a loadlock chamber into a separate processing chamber,
  treating a workpiece in the processing chamber,
  moving the workpiece from the processing chamber into the loadlock chamber,
  positioning the workpiece within the loadlock chamber and relative to a cooling surface of the loadlock chamber to form a gap between the workpiece and the cooling surface,
  disposing the loadlock chamber at a pressure between about 35 Torr and about 760 Torr, such that the gap beneath the workpiece is disposed at a pressure between about 20 Torr and about 745 Torr, thereby forming a net force on the workpiece when within the loadlock chamber that draws the workpiece toward the cooling surface, and
  placing the workpiece back into the processing chamber for further processing.

30. A method for multi-processing a workpiece with an ion source, comprising the steps of:
  placing a the workpiece into a loadlock chamber,
  moving the workpiece between the loadlock chamber and a separate processing chamber,
  treating the workpiece when disposed in the processing chamber,
  removing the workpiece from the processing chamber for subsequent placement within the loadlock chamber,
  positioning the workpiece within the loadlock chamber and relative to a cooling surface of the loadlock chamber to form a gap between the workpiece and the cooling surface,
  disposing the loadlock chamber at a pressure between about 35 Torr and about 760 Torr, such that the gap beneath the workpiece is disposed at a pressure between about 20 Torr and about 745 Torr, thereby forming a net force on the workpiece that draws the workpiece toward the cooling surface, and
  repeating the transfer of the workpiece between the loadlock chamber and the process chamber a selected number of additional times to completely treat the workpiece.

* * * * *